US011342219B2

(12) United States Patent
Fu et al.

(10) Patent No.: US 11,342,219 B2
(45) Date of Patent: May 24, 2022

(54) CHEMICAL MECHANICAL POLISHING TOPOGRAPHY RESET AND CONTROL ON INTERCONNECT METAL LINES

(71) Applicant: Taiwan Semiconductor Manufacturing Co., Ltd., Hsinchu (TW)

(72) Inventors: Shih-Kang Fu, Hsinchu (TW); Ming-Han Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 46 days.

(21) Appl. No.: 17/033,270

(22) Filed: Sep. 25, 2020

(65) Prior Publication Data

US 2022/0102191 A1    Mar. 31, 2022

(51) Int. Cl.
*H01L 21/768* (2006.01)
*H01L 23/522* (2006.01)
*H01L 23/532* (2006.01)

(52) U.S. Cl.
CPC ...... *H01L 21/7682* (2013.01); *H01L 21/7684* (2013.01); *H01L 21/76802* (2013.01); *H01L 21/76849* (2013.01); *H01L 21/76877* (2013.01); *H01L 23/5226* (2013.01); *H01L 23/5329* (2013.01); *H01L 23/53209* (2013.01); *H01L 23/53223* (2013.01); *H01L 23/53238* (2013.01); *H01L 23/53252* (2013.01); *H01L 23/53266* (2013.01)

(58) Field of Classification Search
CPC .......... H01L 21/7682; H01L 21/76802; H01L 21/7684; H01L 21/76849; H01L 21/76877; H01L 23/5226; H01L 23/53209; H01L 23/53223; H01L 23/53238; H01L 23/53252; H01L 23/53266; H01L 23/5329
See application file for complete search history.

(56) References Cited

U.S. PATENT DOCUMENTS

2015/0115404 A1\* 4/2015 Hsueh ................. H01L 23/5223
257/531
2016/0351495 A1\* 12/2016 Paolillo ........... H01L 21/823871

\* cited by examiner

*Primary Examiner* — Karen Kusumakar
(74) *Attorney, Agent, or Firm* — Seed IP Law Group LLP

(57) ABSTRACT

A semiconductor structure is provided. The semiconductor structure include a substrate and a first dielectric layer having at least one via over the substrate. The first dielectric layer includes a first portion having a first thickness and a second portion having a second thickness greater than the first thickness. The semiconductor structure further includes a second dielectric layer containing at least one first conductive line overlying the first portion of the first dielectric layer and at least one second conductive line overlying the second portion of the first dielectric layer. The at least one first conductive line includes a first conductive portion and a conductive cap, and the at least one second conductive line including a second conductive portion having a top surface coplanar with a top surface of the conductive cap.

20 Claims, 29 Drawing Sheets

CHEMICAL MECHANICAL POLISHING TOPOGRAPHY RESET AND CONTROL ON INTERCONNECT METAL LINES

BACKGROUND

Integrated circuits include numerous devices such as transistors, capacitors, resistors, and diodes. These devices, which are initially isolated from one another, are interconnected together through wiring to form functional circuits. Such wiring is done through multiple metallization layers including metal lines, providing lateral electrical connection, and a plurality of vias, providing vertical electrical connection between two neighboring stacked metallization layers. The metal lines and vias are commonly referred to as interconnect structures. Interconnect structures are increasingly determining the limits of performance and the density of advanced integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
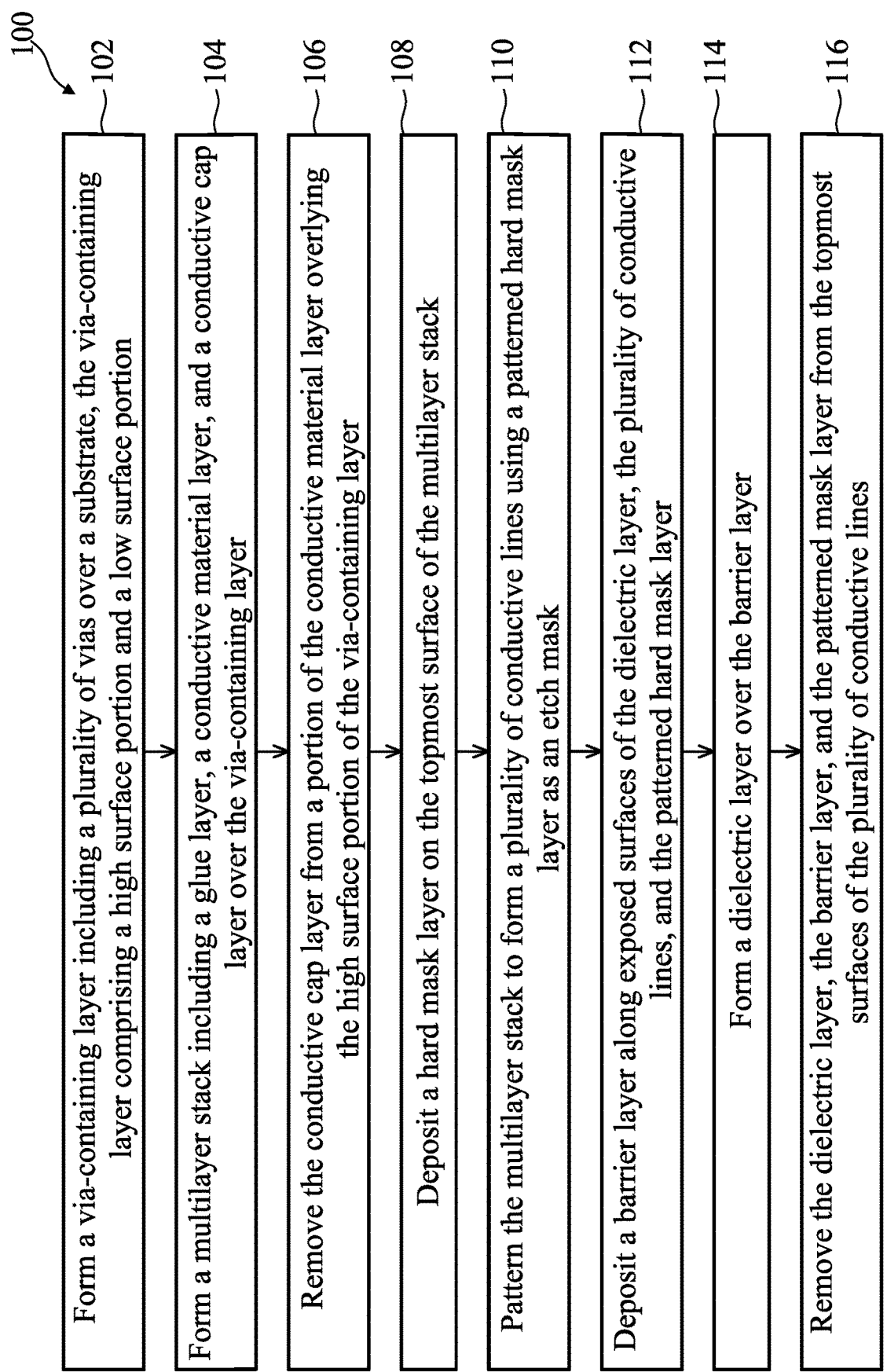
FIG. 1 is a flowchart of a method for fabricating a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The efficiency of the interconnect structure depends on the resistance of each metal line and the coupling capacitance generated between the metal lines. Typically, to reduce the resistance and increase the IC performance, copper interconnect structures are used. As the size of the IC decreases, the spacing between the metal lines decreases. This leads to increase in the coupling capacitance between the metal lines. Increase in the coupling capacitance between the metal lines has a negative impact on signal transmission along metal lines. Furthermore, increase in the coupling capacitance increases energy consumption of the integrated circuit.

One way to reduce the capacitive coupling involves forming air gaps between adjacent metal lines. Air gaps may be formed by selectively anisotropically etching away areas in a layer of metal to leave metal lines which are sequentially covered with a layer of dielectric insulating material to pinch off the spaces between the metal lines. A chemical mechanical polishing (CMP) process is then performed to remove the excess dielectric insulating material from top surfaces of metal lines. Air gaps do, however, present a number of integration and reliability issues. For example, when the underlying via-containing layer is not planar and has a stepped topography, the metal lines formed thereon can have different heights. Accordingly, when CMP is performed to remove the deposited dielectric insulating material from the top of the metal lines, air gaps located above the high surface portion of the via-containing layer may be punched through, causing shorts between adjacent metallization layers. As a result, the reliability of the integrated circuit is adversely affected.

In embodiments of the present disclosure, methods for topography rest are provided to prevent punch through of air gaps during fabrication of interconnect metal lines. In the topography rest, metal caps are introduced to compensate the height differences between metal lines in different regions of the substrate, thereby providing planar surfaces for the subsequent CMP process. As a result, punch through of air gaps is prevented, and the reliability of the integrated circuit is increased.

FIG. 1 is a flowchart of a method 100 for fabricating a semiconductor structure 200, in accordance with some embodiments. FIGS. 2A-2H are cross-sectional views of the semiconductor structure 200 in various stages of the method 100, in accordance with some embodiments. The method 100 is discussed in detail below, with reference to the semiconductor structure 200, in FIGS. 2A-2H. In some embodiments, additional operations are performed before, during, and/or after the method 100, or some of the operations described are replaced and/or eliminated. In some embodiments, additional features are added to the semiconductor structure 200. In some embodiments, some of the features described below are replaced or eliminated. One of ordinary skill in the art would understand that although some embodiments are discussed with operations performed in a particular order, these operations may be performed in another logical order.

Figure 2A:
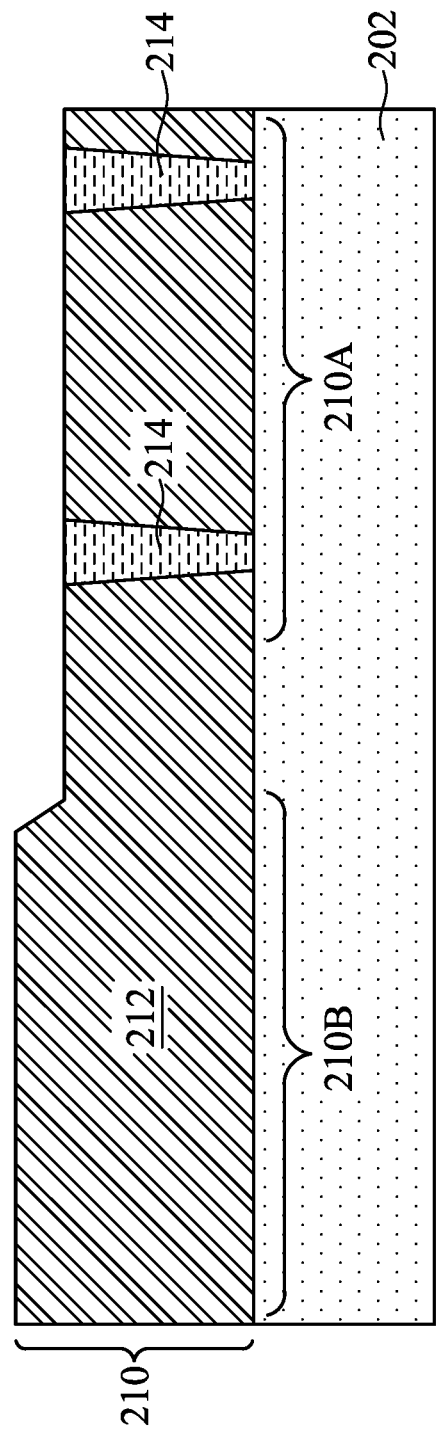
FIGS. 2A-2H are cross-sectional views of a first exemplary semiconductor structure during various stages of the method of FIG. 1, in accordance with some embodiments.

Referring to FIG. 1 and FIG. 2A, the method 100 includes operation 102, in which a via-containing layer 210 is formed over a substrate 202. FIG. 2A is a cross-sectional view of an initial semiconductor structure after forming the via-containing layer 210 over the substrate 202, in accordance with some embodiments.

The substrate 202 is provided first. In some embodiments, the substrate 202 is a bulk semiconductor substrate including silicon. Alternatively or additionally, in some embodiments, the bulk semiconductor substrate includes another elementary semiconductor such as germanium, a compound semiconductor including gallium arsenide, gallium phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 202 includes an epitaxial layer. For example, the substrate 202 has an epitaxial layer overlying a bulk semiconductor substrate. Furthermore, in some embodiments, the substrate 202 is a semiconductor on insulator (SOI) substrate. For example, the substrate 202 includes a buried oxide (BOX) layer formed by a process such as separation by implanted oxygen (SIMOX) or other suitable techniques, such as wafer bonding and grinding.

In some embodiments, the substrate 202 further includes active devices such as p-type field effect transistors (PFET), n-type field effect transistors (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 202 further includes passive devices such as resistors, capacitors, and/or inductors. The substrate 202 further includes isolation structures such as shallow trench isolation (STI) structures to separate various active and/or passive devices from one another. For simplicity, any such circuit elements are not shown in FIG. 2A.

The via-containing layer 210 is disposed over the substrate 202. In some embodiments and as in FIG. 2A, the via-containing layer 210 is deposited directly above and in contact with the substrate 202. In some embodiments, one or more dielectric layers containing vias and/or conductive lines therein may be disposed between the via-containing layer 210 and the substrate 202.

The via-containing layer 210 includes a dielectric layer 212 and a plurality of vias 214 therein. The vias 214 are used to provide vertical connections for conductive lines in adjacent metallization layers, e.g., a $M_x$ layer and a $M_{x+1}$ layer. In some embodiments, the via-containing layer 210 is formed with at least a low surface portion 210A having a first thickness and a high surface portion 210B having a second thickness that is greater than the first thickness. The via-containing layer 210 thus has a stepped topography in which a surface of the via-containing layer 210 in the low surface portion 210A is located below a surface of the via-containing layer 210 in the high surface portion 210B. In some embodiments and as in FIG. 2A, the vias 214 are located in the low surface portion 210A, and the high surface portion 210B is a non-via region or a low density via region containing more isolated vias than vias 214 in the low surface portion 210A (not shown).

In some embodiments, the dielectric layer 212 includes silicon oxide, silicon nitride, or silicon oxynitride. In some embodiments, the dielectric layer 212 includes a low-k dielectric material having a dielectric constant (k) less than 4. In some embodiments, the low-k dielectric material has a dielectric constant of about 3.5 or less, about 3 or less, about 2.8 or less, about 2.5 or less, about 2.0 or less, or about 1.5 or less. In some embodiments, the dielectric layer 212 includes silicon oxide made from an oxide precursor such as tetraethylorthosilicate (TEOS), undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the dielectric layer 212 is deposited by any suitable deposition process such as, for example, chemical vapor deposition (CVD), plasma enhanced chemical vapor deposition (PECVD), physical vapor deposition (PVD), or spin coating. In some embodiments, the dielectric layer 212 is planarized by a planarization process or otherwise recessed to provide a planar top surface. In some embodiments, the top surface of the dielectric layer 212 is planarized using a CMP process.

The dielectric layer 212 is subsequently etched to form via openings (not shown) extending through the dielectric layer 212. In some embodiments, the dielectric layer 212 is etched with lithography and etching processes. In some embodiments, the lithography process includes applying a photoresist layer (not shown) on the dielectric layer 212, exposing the photoresist layer to a pattern, performing post-exposure baking, and developing the resist to form a patterned photoresist layer (not shown). The patterned photoresist layer exposes portions of the dielectric layer 212 where the via openings are to be formed. Next, the portions of the dielectric layer 212 that are exposed by the patterned photoresist layer are etched away to form the via openings. In some embodiments, the dielectric layer 212 is etched using a dry etch such as, for example, a reactive ion etch (RIE) or a plasma etch. In some embodiments, the dielectric layer 212 is etched using a wet etch. After formation of the via openings in the dielectric layer 212, the patterned photoresist layer is removed, for example, by wet stripping or plasma ashing. Alternatively, in some embodiments, a hard mask is used. The hard mask is formed between the photoresist layer and the dielectric layer 212. Accordingly, the via opening pattern is first transferred from the patterned photoresist layer to the hard mask by a first etch and then transferred from the patterned hard mask to the dielectric layer 212 by a second etch.

Thereafter, a conductive metal is then filled in the via openings. Examples of conductive metals that can be used in the present disclosure include, but are not limited to, copper (Cu), aluminum (Al), tungsten (W), cobalt (Co), an alloy thereof, or other suitable conductive metals. In some embodiments, the conductive metal is deposited by a suitable deposition process such as, for example, CVD, PECVD, sputtering, or plating. After deposition, excess portions of conductive metal are removed from the top surface of the dielectric layer 212 using a planarization process such as CMP. The conductive metal remaining in the via openings constitute the vias 214.

In some embodiments, prior to depositing the conductive metal, a metal liner layer is deposited on sidewalls and bottoms of the via openings and on the top surface of the dielectric layer 212. In some embodiments, the metal liner layer includes a diffusion barrier material that prevents the conductive metal from diffusing into the dielectric layer 212. In some embodiments, the metal liner layer includes titanium (Ti), titanium nitride (TiN), tantalum (Ta), tantalum nitride (TaN), ruthenium (Ru), ruthenium nitride (RuN), or other suitable diffusion barrier materials. In some embodiments, the metal liner layer includes a stack of the above-mentioned diffusion barrier materials such as, for example, Ti/TiN or Ta/TaN. In some embodiments, the metal liner layer is deposited utilizing a conformal deposition process such as CVD, PECVD, PVD, or atomic layer deposition (ALD). After filling the via openings with the conductive metal and removing the excess conductive metal, the excess metal liner material on the top surface of the dielectric layer 212 is also removed, for example, by CMP, thereby forming metal liners (not shown) surrounding the vias 214.

Figure 2B:
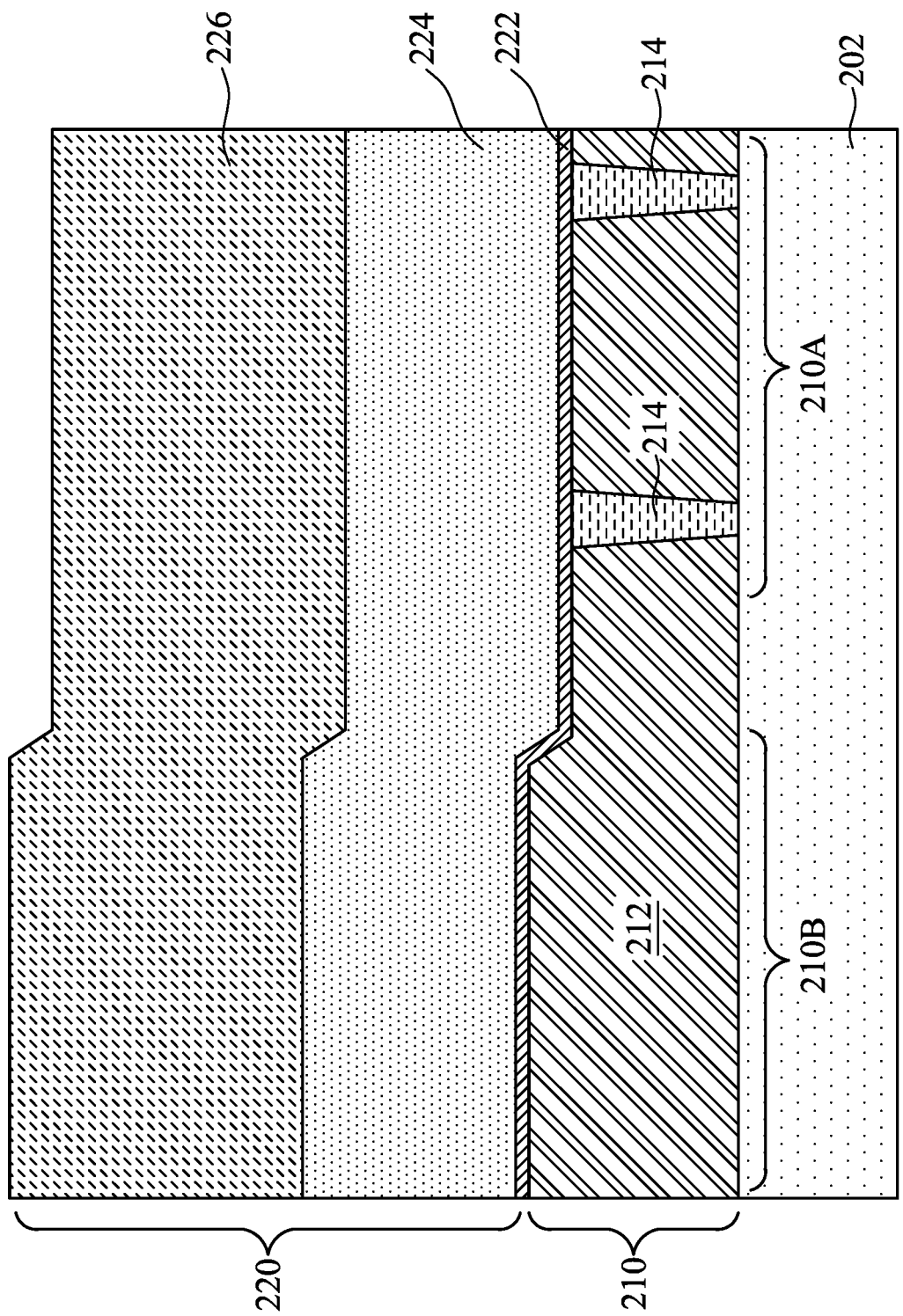

Referring to FIG. 1 and FIG. 2B, the method 100 proceeds to operation 104, in which a multilayer stack 220 including a glue layer 222, a conductive material layer 224, and a conductive cap layer 226 is formed on the via-containing layer 210. FIG. 2B is a cross-sectional view of the semiconductor structure of FIG. 2A after forming the multilayer stack including the glue layer 222, the conductive material layer 224, and the conductive cap layer 226 on the via-containing layer 210, in accordance with some embodiments.

The glue layer 222 is disposed on the via-containing layer 210. The glue layer 222 is adapted to enhance adhesion between adjacent layers, i.e., the via-containing layer 210 and the conductive material layer 224. In some embodiments, the glue layer 222 includes a metal nitride such as, for example, tantalum nitride (TaN), titanium nitride (TiN), manganese nitride (MnN), or tungsten nitride (WN). In some embodiments, the glue layer 222 is deposited using any suitable conformal deposition method such as, for example, PVD, CVD, or ALD. The conformal deposition forms a layer that is relatively uniform in thickness over the surface being coated, and thus allows the layer to conform with the topography of the underlying layer. As a result of the conformal deposition, the glue layer 222 conforms to the stepped topography of the underlying via-containing layer 210. The glue layer 222 thus also has a stepped topography. In some embodiments, the glue layer 222 that is formed has a thickness ranging from about 10 angstroms (Å) to about 30 Å, although lesser or greater thicknesses can also be employed. If the thickness of the glue layer 222 is too small, the adhesion effect provided by the glue layer 222 is insufficient, in some instances. If the thickness of the glue layer 222 is too great, the contact resistance of the resulting conductive lines is increased, which reduces the integrated circuit performance.

The conductive material layer 224 is disposed on the glue layer 222. In some embodiments, the conductive material layer 224 includes a conductive metal such as, for example, ruthenium (Ru), iridium (Ir), rhodium (Rh), platinum (Pt), cobalt (Co), molybdenum (Mo), tungsten (W), copper (Cu), nickel (Ni), silver (Ag), aluminum (Al), or any combination thereof. In some embodiments, the conductive material layer 224 is deposited using any suitable conformal deposition method such as, for example, PVD, CVD, or electrochemical plating. As a result of the conformal deposition, the conductive material layer 224 conforms to the stepped topography of the underlying via-containing layer 210. The conductive material layer 224 thus also has a stepped topography. In some embodiments, the conductive material layer 224 that is formed has a thickness ranging from about 150 Å to about 1500 Å, although lesser or greater thicknesses can also be employed.

The conductive cap layer 226 is disposed on the conductive material layer 224. The conductive cap layer 226 includes a conductive metal different from the conductive metal of the conductive material layer 224. Examples of conductive metals that can be used in the conductive cap layer 226 include, but are not limited to, Ru, Ir, Rh, Pt, Co, Mo, W, Cu, Ni, Ag, or Al. In some embodiments, the conductive cap layer 226 is deposited using a suitable conformal deposition method such as, for example, PVD, CVD, or electrochemical plating. As a result of the conformal deposition, the conductive cap layer 226 conforms to the stepped topography of the underlying via-containing layer 210. The conductive cap layer 226 thus also has a stepped topography. In some embodiments, the conductive cap layer 226 that is formed has a thickness ranging from about 50 Å to about 500 Å, although lesser or greater thicknesses can also be employed. If the thickness of the conductive cap layer 226 is too small, the conductive cap subsequently formed cannot compensate the high differences of conductive lines, and air gap punch through occurs. If the thickness of the conductive cap layer 226 is too great, the material is wasted and the manufacturing cost is increased.

Figure 2C:
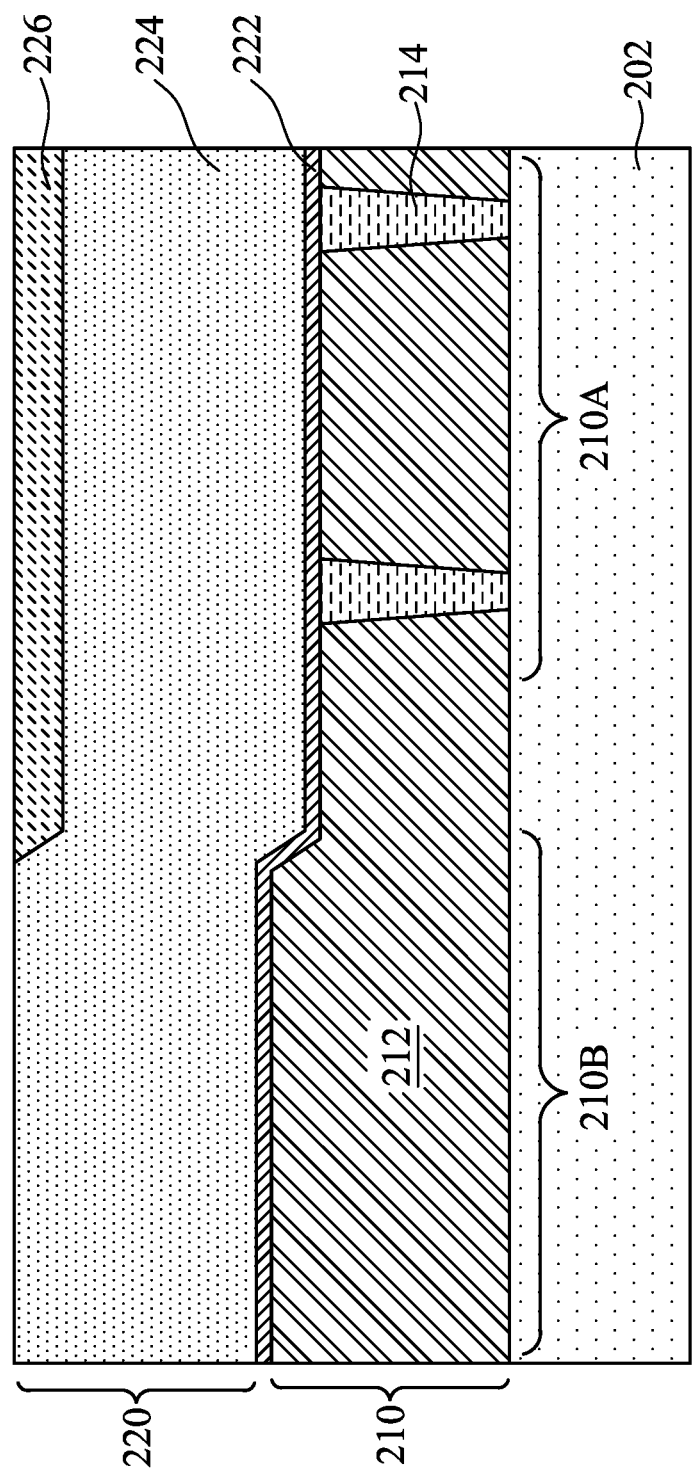

Referring to FIG. 1 and FIG. 2C, the method 100 proceeds to operation 106, in which the conductive cap layer 226 is removed from the high surface portion of the conductive material layer 224. FIG. 2C is a cross-sectional view of the semiconductor structure of FIG. 2B after removing the conductive cap layer 226 from the high surface portion of the conductive material layer 224, in accordance with some embodiments.

In some embodiments, a CMP process is performed to remove the conductive cap layer 226 from the high surface portion of the conductive material layer 224, that is, the portion of the conductive material layer 224 overlying the high surface portion 210B of the via-containing layer 210. During the CMP process, a combination of etching materials and abrasive material are put in contact with the conductive cap layer 226 and a polishing pad (not shown) is used to grind away the conductive cap layer 226 until the high surface portion of the conductive material layer 224 is exposed. After the CMP process, the conductive cap layer 226 is left only in the low surface portion of the conductive material layer 224 (i.e., the portion of the conductive material layer 224 overlying the low surface portion 210A of the via-containing layer 210) and the high surface portion of the conductive material layer 224 is exposed. The top surface of the conductive cap layer 226 is coplanar with the top surface of the high surface portion of the conductive material layer 224.

The CMP polishes the conductive cap layer 226 with a slurry including abrasive particles. Examples of abrasive particles include, but are not limited to, colloidal silica, fume silica, ceria, titania and alumina. In some embodiments, the slurry includes a single type of abrasive particles. In some other embodiments, the slurry includes a mixture of two or more types of abrasive particles. The slurry generally comprises from about 10% to 40% by weight of abrasive particles. In some embodiments, the abrasive particles are irregularly shaped and generally cluster together to form secondary particles that are in a mean size range of about 100 nm to about 200 nm.

To help to obtain favorable polishing rates, the slurry further includes chemical additives such as, for example, a pH adjusting agent, a surfactant, an oxidizing agent, and a chelating agent.

The pH adjusting agent is used to maintain the pH level of the slurry in a range, for example, from about 3 to about 10. The pH adjusting agent can include basic substances such as an aqueous ammonia, potassium hydroxide, sodium hydroxide or water-soluble organic amines. Alternatively, the pH adjusting agent can include an acid such as hydrochloric acid or sulfuric acid.

The surfactant can include an anionic surfactant, a cationic surfactant, or a nonionic surfactant. In some embodiments, the surfactant is a polymeric surfactant such as polyacrylic acids or salts thereof, acrylate copolymers and ethylene oxide/propylene oxide block copolymers (Pluronics), and the like.

The oxidizing agent is used to oxidize the conductive metal in the conductive cap layer 226 to a metal oxide which can be removed by mechanical grinding. In some embodiments, the oxidizing agent can include hydrogen peroxide ($H_2O_2$), potassium periodate ($KIO_4$), sodium chlorate (NaClO), potassium permanganate ($KMnO_4$), and the like.

The chelating agent is used to form a complex with the conductive metal so as to facilitate the removal of the oxidized metal. In some embodiments, the chelating agent can include polycarboxylic acids such as oxalic acid, succinic acid, phthalic acid and trimellitic acid; hydroxycarboxylic acids such as glycolic acid, malic acid, citric acid and salicylic acid; polyaminocarboxylic acids such as nitrilotriacetic acid and ethylenediaminetetraacetic acid; phosphonic acids such as aminotri(methylenephosphonic acid) and 1-hydroxyethylidene-1,1-diphosphon-ic acid, alkyl amines, and the like.

The CMP process is effected at, for example, a platen RPM from about 30 to about 100, a head RPM from about 20 to about 90, and a head down force from about 0.5 psi to about 2.5 psi. The end point of the CMP process is detected using an in-situ eddy current monitoring system or an optical monitoring system.

Figure 2D:
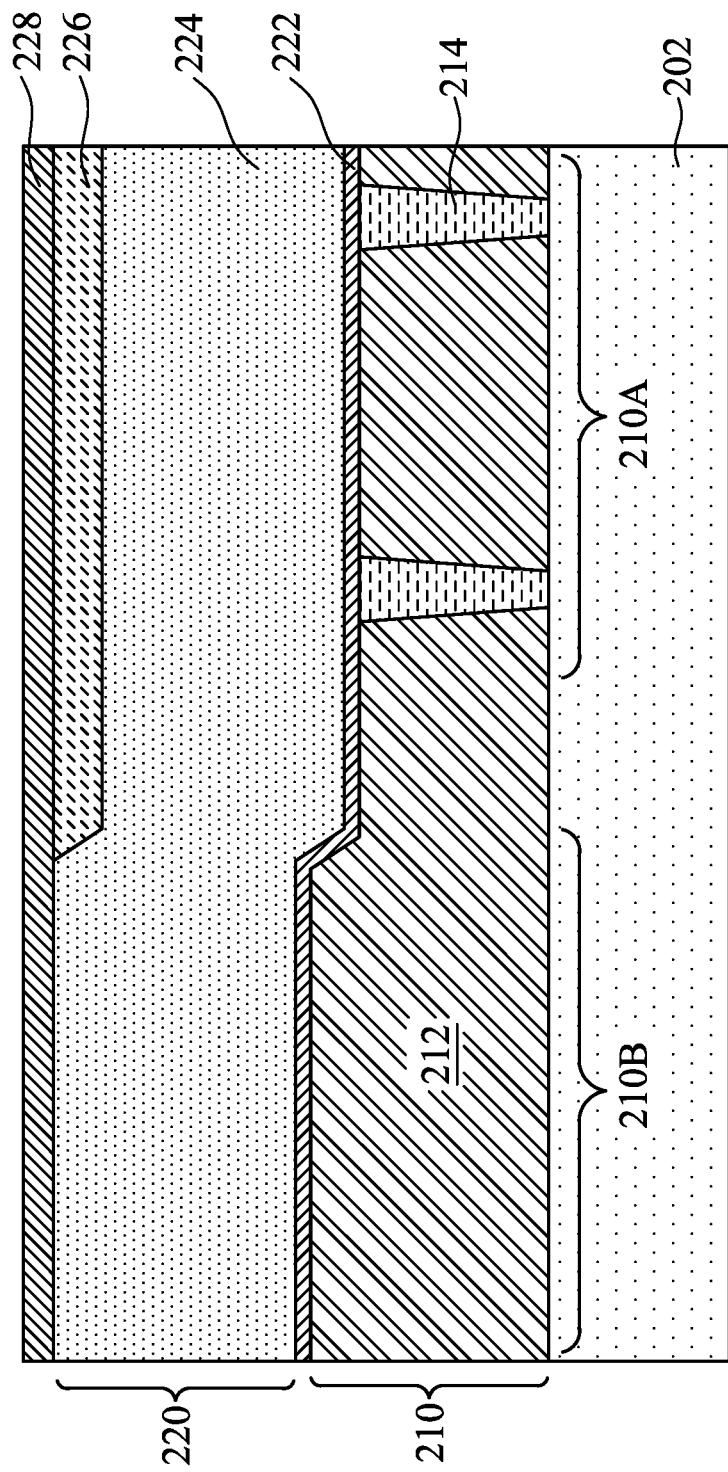

Referring to FIG. 1 and FIG. 2D, the method 100 proceeds to operation 108, in which a hard mask layer 228 is deposited on the topmost surface of the multilayer stack 220. FIG. 2D is a cross-sectional view of the semiconductor structure of FIG. 2C after depositing the hard mask layer 228 on the topmost surface of the multilayer stack 220, in accordance with some embodiments.

The hard mask layer 228 is disposed on the surfaces of the conductive material layer 224 and the conductive cap layer 226. In some embodiments, the hard mask layer 228 includes a dielectric material such as, for example, silicon oxide, silicon nitride, silicon oxynitride, or combinations thereof. In some other embodiments, the hard mask layer 228 includes a metal nitride such as TiN or MnN; or a metal carbide such as WC. The hard mask layer 228 may be deposited by any suitable deposition process such as, for example, CVD, PECVD, or PVD. The hard mask layer 228 that is formed has a thickness ranging from about 30 Å to about 200 Å, although lesser or greater thicknesses can also be employed. If the thickness of the mask layer is too small, the good etching to the mask layer cannot be achieved. If the thickness of the mask layer is too great, the subsequent lithography may fail due to light strongly reflected from the mask layer.

Figure 2E:
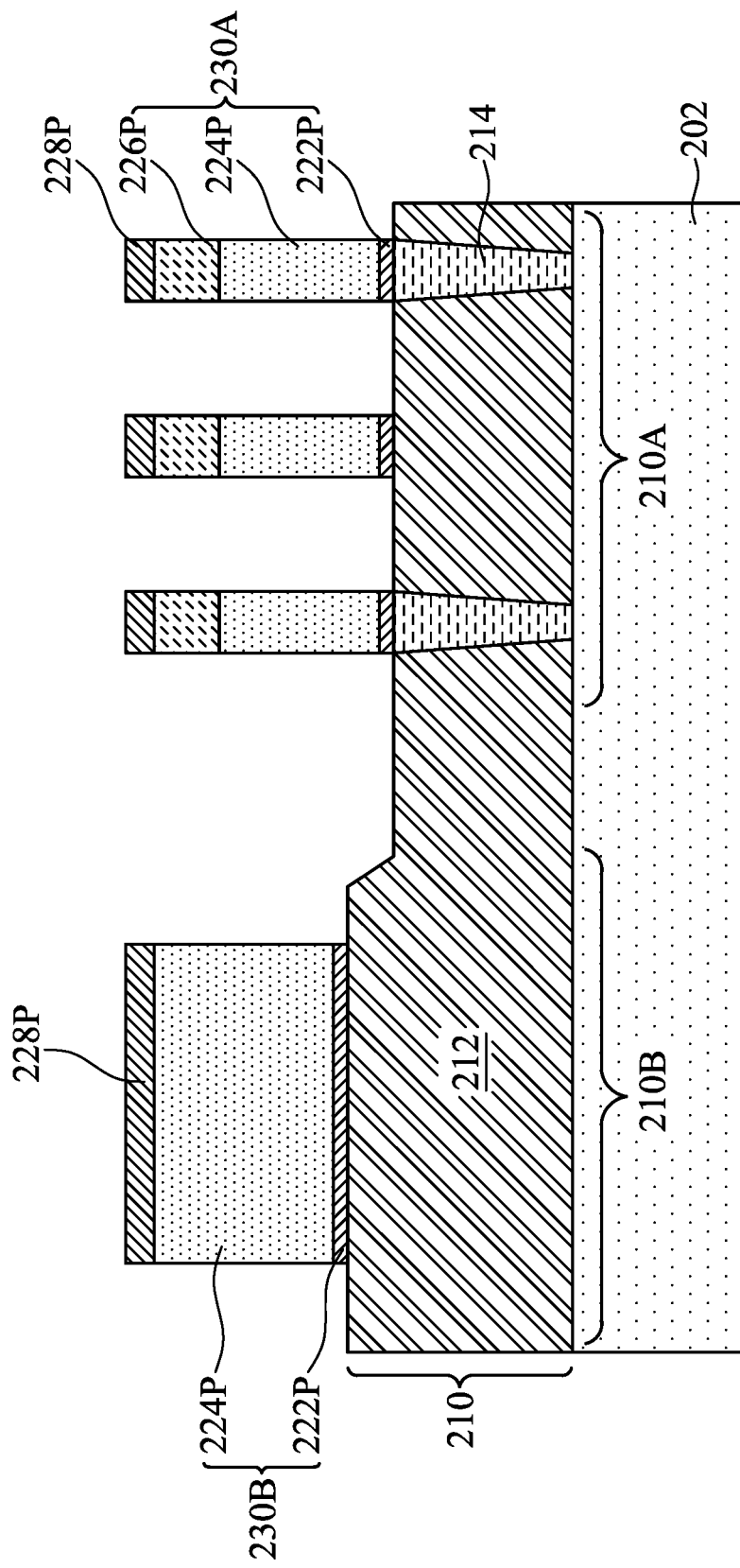

Referring to FIG. 1 and FIG. 2E, the method 100 proceeds to operation 110, in which the multilayer stack 220 is patterned to form a plurality of conductive lines 230A, 230B. FIG. 2E is a cross-sectional view of the semiconductor structure of FIG. 2D after patterning the multilayer stack 220 to form the plurality of conductive lines 230A, 230B, in accordance with some embodiments.

The conductive lines 230A, 230B include a plurality of first conductive lines 230A located above the low surface portion 210A of the via-containing layer 210 and one or more second conductive lines 230B located above the high surface portion 210B of the via-containing layer 210. For simplicity, three first conductive lines 230A and a single second conductive line 230B are illustrated in FIG. 2E. The first conductive lines 230A are formed as narrow metal lines with a line width ranging from, for example, about 10 nm to about 20 nm and a line spacing ranging from, for example, about 10 nm to about 20 nm. The first conductive lines 230A contact the corresponding vias 214 in the via-containing layer 210. The second conductive line 230B is formed as a wide metal line having a line width ranging from, for example, about 40 nm to about 1 μm. Each of the first conductive lines 230A includes, from bottom to top, a glue portion 222P, a conductive portion 224P, and a conductive cap 226P. The second conductive line 230B includes a glue portion 222P and a conductive portion 224P. The additional conductive cap 226P in the first conductive line 230A compensates the height difference between the first conductive line 230A and the second conductive line 230B due to the presence of the low surface portion 210A and the high surface portion 210B in the via-containing layer 210. As a result, the topmost surface of the first conductive line 230A is coplanar with the topmost surface of the second conductive line 230B.

To form the first and second conductive lines 230A, 230B, first, the hard mask layer 228 is etched, using the patterned photoresist layer (not shown) as an etch mask to form a patterned hard mask layer 228P. In some embodiments, the patterned photoresist layer is produced by applying a photoresist (not shown) on the hard mask layer 228, exposing the photoresist layer to a pattern of radiation, and then developing the photoresist layer using a resist developer. An anisotropic etch can be performed to remove portions of the hard mask layer 228 that are not covered by the patterned photoresist layer. The anisotropic etch can be a dry etch such as RIE or a wet etch that removes material of the hard mask layer 228 selective to the conductive metal of the conductive material layer 224 and the conductive metal of the conductive cap layer 226. In some embodiments, etching of the hard mask layer 228 is performed by RIE using, for example, a fluoride-containing gas including $NF_3$, $SF_6$, $CF_4$, and/or $CHF_3$. In some other embodiments, etching of the hard mask layer 228 is performed by a wet etch using, for example, a diluted hydrofluoric (HF) acid. After pattering the hard mask layer 228, the patterned photoresist layer can be removed, for example, by ashing.

The multilayer stack 220 is then etched using the patterned hard mask layer 228P as an etch mask to form conductive lines 230A, 230B. In some embodiments, the glue layer 222, the conductive material layer 224, and the conductive cap layer 226 are etched using a single anisotropic etching process. In some other embodiments, the glue layer 222, the conductive material layer 224, and the conductive cap layer 226 are individually etched using three different etching processes. The anisotropic etch may be a dry etch such as RIE, a wet etch, or a combination thereof. After etching, each remaining portion of the glue layer 222 constitutes the glue portion 222P, each remaining portion of the conductive material layer 224 constitutes the conductive portion 224P, and each remaining portion of the conductive cap layer 226 constitutes the conductive cap 226P. In some embodiments and as in FIG. 2E, the conductive lines 230A, 230B are formed with substantially vertical sidewalls. In other embodiments, the conductive lines 230A, 230B are formed with sloped sidewalls (not shown). In some embodiments, the width at the top of the conductive lines 230A, 230B is larger than the width at the base of the conductive lines 230A, 230B.

Figure 2F:
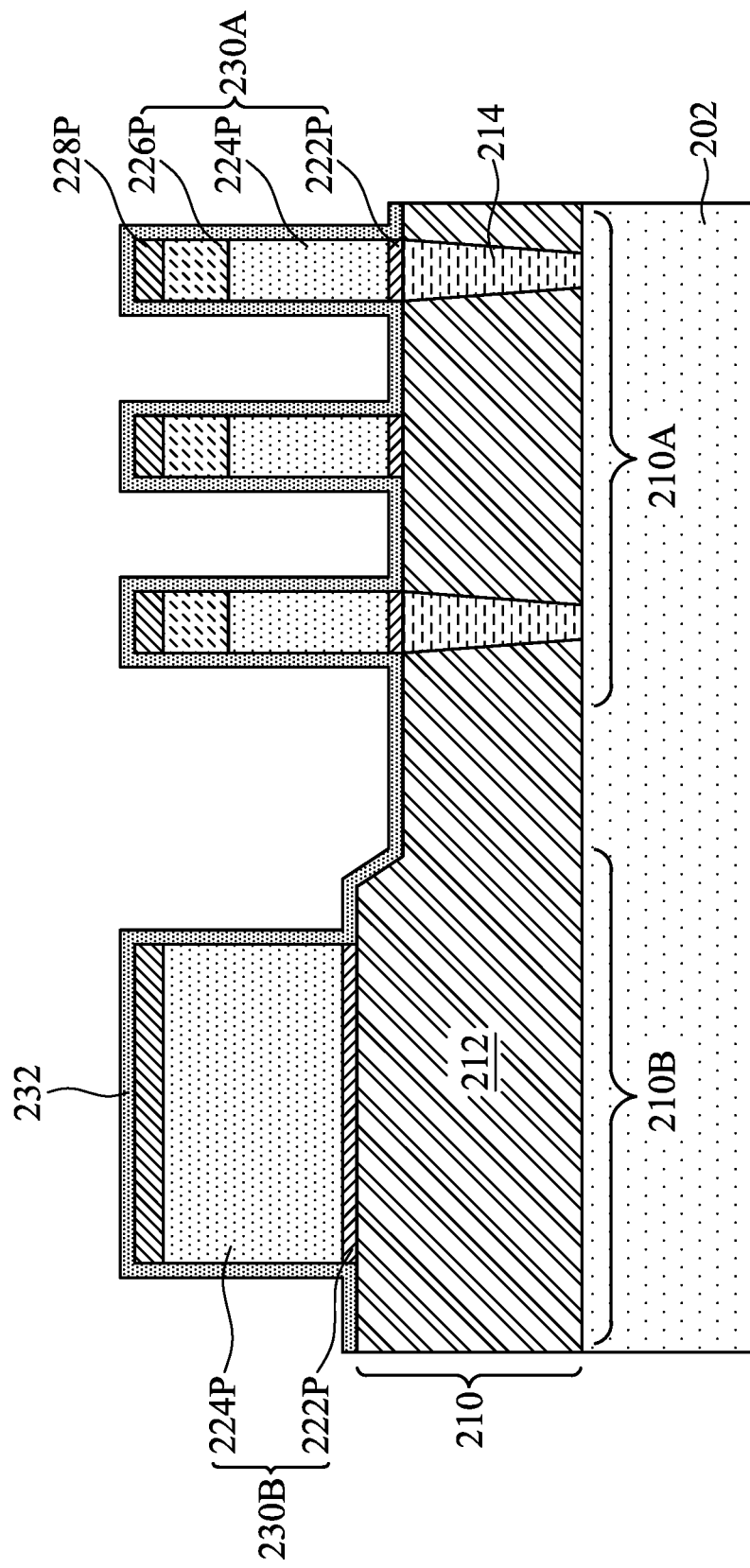

Referring to FIG. 1 and FIG. 2F, the method 100 proceeds to operation 112, in which a barrier layer 232 is deposited along exposed surfaces of the dielectric layer 212, the first and second conductive lines 230A, 230B, and the patterned hard mask layer 228P. FIG. 2F is a cross-sectional view of the semiconductor structure of FIG. 2E after depositing the barrier layer 232 along the exposed surfaces of the dielectric layer 212, the first and second conductive lines 230A, 230B, and the patterned hard mask layer 228P, in accordance with some embodiments.

The barrier layer 232 serves as a diffusion barrier between the first and second conductive lines 230A, 230B and a dielectric layer subsequently formed. In some embodiments, the barrier layer 232 includes a dielectric material such as, for example, silicon carbon nitride, silicon carbide, oxygen-doped silicon carbide (ODC), silicon oxide; or a metal oxide including hafnium oxide or aluminum oxide, or aluminum oxynitride. In some embodiments, the barrier layer 232 is deposited using a conformal deposition process such as, for example, CVD, PECVD, or ALD. In some embodiments, the barrier layer 232 that is formed can have a thickness ranging from about 5 Å to about 35 Å, although lesser or greater thicknesses can also be employed. If the thickness of the barrier layer 232 is too small, the diffusion of the conductive metal from the conductive lines 230A, 230B into the surrounding dielectric material occurs, which adversely affects the reliability of the integrated circuits. On the other hand, if the thickness of the barrier layer 232 is too great, there is no further improvement on the barrier effect; however, the material is wasted and manufacturing cost is increased.

Figure 2G:
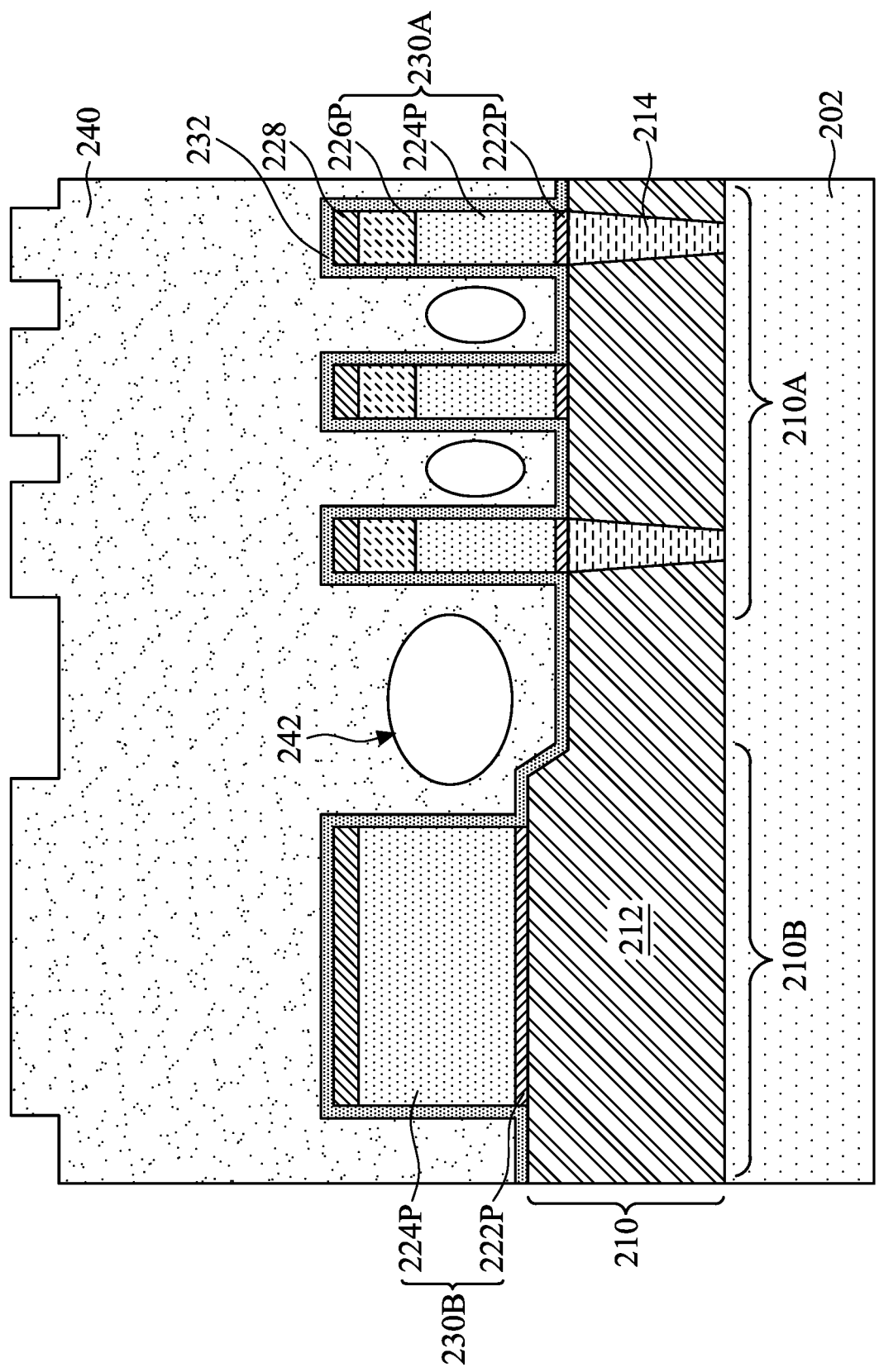

Referring to FIG. 1 and FIG. 2G, the method 100 proceeds to operation 114, in which a dielectric layer 240 is formed over the barrier layer 232. FIG. 2G is a cross-sectional view of the semiconductor structure of FIG. 2F after forming the dielectric layer 240 over the barrier layer 232, in accordance with some embodiments.

The dielectric layer 240 fills some or entire spaces between the first and second conductive lines 230A, 230B. In some embodiments, the dielectric layer 240 includes a low-k dielectric material such as, for example, silicon oxide made from an oxide precursor such as tetraethylorthosilicate (TEOS), undoped silicate glass, or doped silicate glass such as borophosphosilicate glass (BPSG), fluorosilica glass (FSG), phosphosilicate glass (PSG), or boron doped silicon glass (BSG). In some embodiments, the dielectric layer 240 is deposited by any suitable deposition process such as, for example, CVD, PECVD, PVD, or spin coating. The thickness of the dielectric layer 240 can be from about 100 nm to about 300 nm, although lesser and greater thicknesses can also be employed.

In some embodiments and as in FIG. 2G, air gaps 242 are formed in the dielectric layer 240 between adjacent conductive lines 230A, 230B. The presence of the air gaps 242 lowers the effective dielectric constant of the dielectric layer 240, which in turn reduces the capacitance coupling between conductive lines 230A, 230B. In some embodiments, the air gaps 242 can be self-forming during deposition of the dielectric layer 240. During the self-forming process, the dielectric layer 240 pinches off the spaces between conductive lines 230A, 230B. In some other embodiments, the air gaps 242 can be formed by first depositing a sacrificial material (not shown) over the barrier layer 232 to partially fill spaces between the conductive lines 230A, 230B, following by depositing the dielectric layer 240 over the sacrificial material to completely fill the spaces between the conductive lines 230A, 230B. Subsequently, the sacrificial material is removed, for example, through an ultraviolet exposure or a thermal annealing, providing the air gaps 242 occupying volumes previously occupied by the sacrificial material.

Figure 2H:
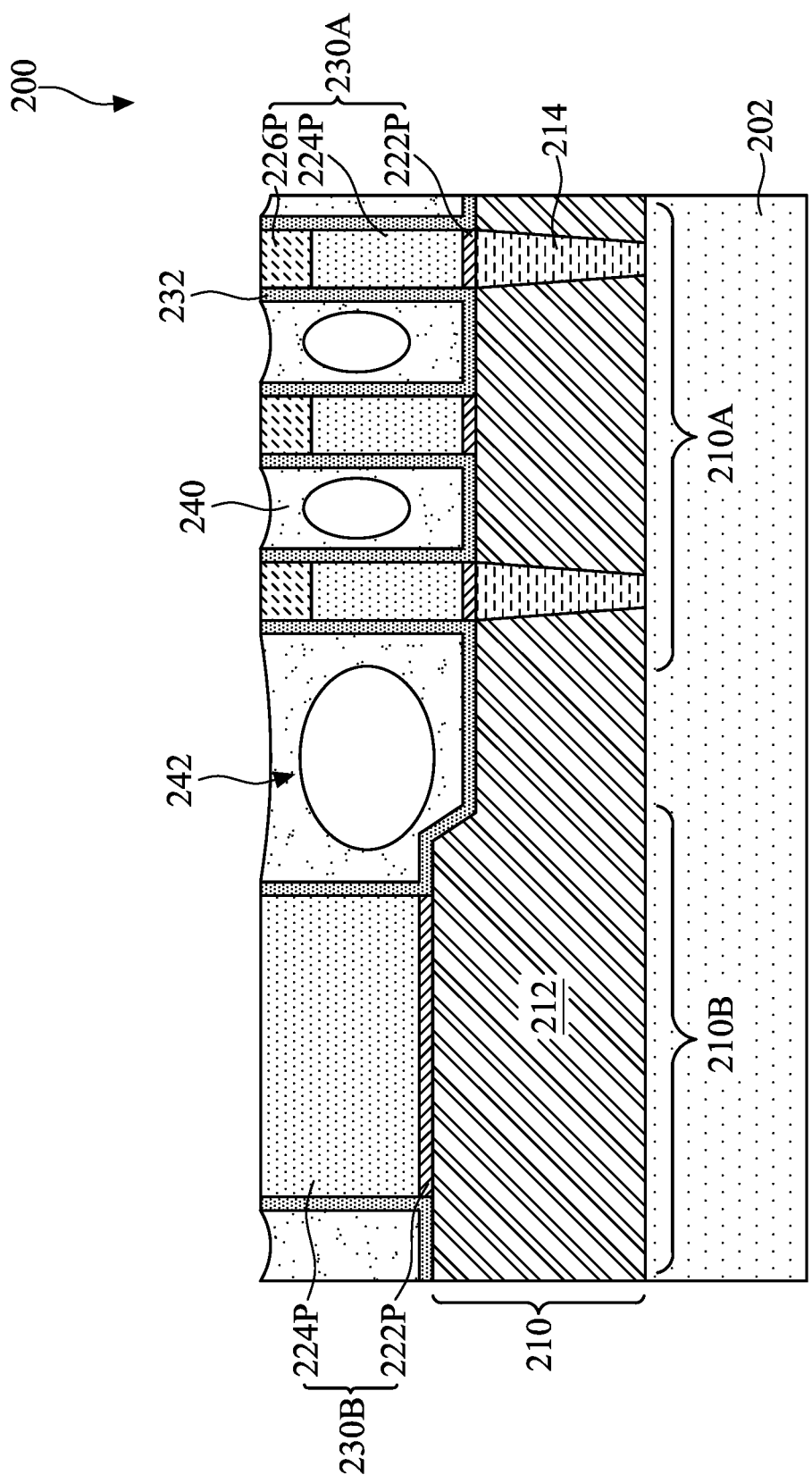

Referring to FIG. 1 and FIG. 2H, the method 100 proceeds to operation 116, in which the dielectric layer 240, the barrier layer 232, and the patterned hard mask layer 228P are removed from the topmost surfaces of the first and second conductive lines 230A, 230B. FIG. 2H is a cross-sectional view of the semiconductor structure of FIG. 2G after removing the dielectric layer 240, the barrier layer 232, and the patterned hard mask layer 228P from the topmost surfaces of the first and second conductive lines 230A, 230B, in accordance with some embodiments.

The removal of the dielectric layer 240, the barrier layer 232, and the patterned hard mask layer 228P from the topmost surfaces of the first and second conductive lines 230A, 230B can be implemented by one or more CMP processes. After CMP, the top surface of the dielectric layer 240 and the barrier layer 232 are substantially coplanar with the topmost surfaces of the first conductive lines 230A (i.e., the top surfaces of the conductive cap 226P) and the topmost surface of the second conductive line 230B (i.e., the top surface of the conductive portion 224P). The topmost surfaces of respective first and second conductive lines 230A, 230B are exposed.

In some embodiments, multiple CMP processes are performed. For example, a first CMP process is performed to polish the dielectric layer 240 and the barrier layer 232 until the top surfaces of the patterned hard mask layer 228P are exposed. The parameters of the first CMP process are controlled so that the first CMP process stops on the patterned hard mask layer 228P. The slurry that can be used in the first CMP process includes abrasive particles, a surfactant, a pH adjusting agent, a chelating agent such as alkylamine, and an oxidant such as $H_2O_2$. The pH of the slurry is controlled in the range, for example, from 3 to 10. In some embodiments, the first CMP process is effected at, for example, a platen RPM from about 30 to about 130, a head RPM from about 20 to about 100, and a head down force from about 0.5 psi to about 2.5 psi. The end point of the first CMP process is detected using an in-situ eddy current monitoring system or an optical monitoring system.

A second CMP process is then performed to remove the patterned hard mask layer 228P and to expose the topmost surfaces of respective first and second conductive lines 230A, 230B. The parameters of the second CMP process are controlled so that the second CMP process stops on the conductive portion 224P and the conductive cap 226P. The slurry that can be used in the second CMP process includes abrasive particles, a surfactant, a pH adjusting agent, a metal corrosion inhibitor such as benzotriazole and its derivatives, an oxidant such as $H_2O_2$, and a chelating agent such as alkylamine. The slurry can be an acidic slurry having pH ranging from about 3 to about 6, or a basic slurry having pH ranging from about 9 to about 10. In some embodiments, the second CMP process is effected at, for example, a platen RPM from about 60 to about 90, a head RPM from about 57 to about 85, and a head down force from about 0.5 psi to about 2.0 psi. The end point of the second CMP process is detected using an in-situ eddy current monitoring system or an optical monitoring system.

Figure 3:
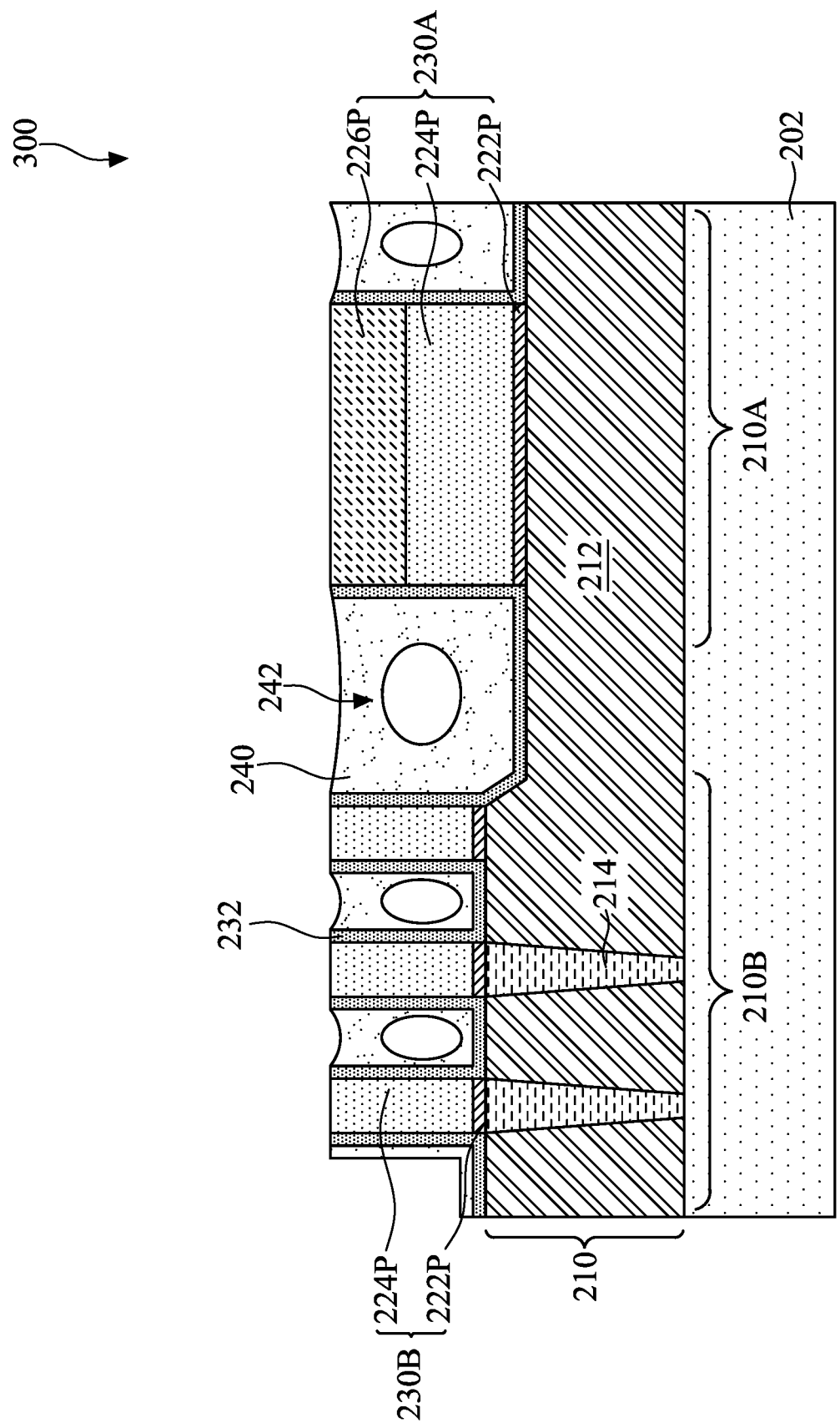
FIG. 3 is a cross-sectional view of a second exemplary semiconductor structure obtained using the method of FIG. 1, in accordance with some embodiments.

FIG. 3 is a cross-sectional view of a semiconductor structure 300 that can be formed by performing the method 100, in accordance with some embodiments. Components in the semiconductor structure 300 that are the same or similar to the semiconductor structure 200 are given the same references numbers, and detailed description thereof is thus omitted.

Referring to FIG. 3, the semiconductor structure 300 includes a substrate 202, a via-containing layer 210 comprising a plurality of vias 214 over the substrate, and a metallization layer comprising a dielectric layer 240 and a plurality of conductive lines 230A, 230B formed therein. Air gaps 242 are formed between adjacent conductive lines 230A, 230B. A barrier layer 232 is present on sidewalls of the conductive lines 230A, 230B to prevent the conductive metal(s) in the conductive portions 224P and conductive caps 226P from diffusing into the dielectric layer 240.

Unlike the semiconductor structure 200 in which the vias 214 in the via-containing layer 210 are located in the low surface portion 210A of the via-containing layer 210, in the semiconductor structure 300, the vias 214 are located in the high surface portion 210B of the via-containing layer 210 according to a different circuit design. Accordingly, in the semiconductor structure 300, the plurality of conductive lines includes a first conductive line 230A overlying the low surface portion 210A of the via-containing layer 210 and a plurality of second conductive lines 230B overlying the high surface portion 210B of the via-containing layer 210. The first conductive line 230A is formed as a wide metal line having a line width ranging from about 40 nm to about 1 µm. The second conductive lines 230B are formed as narrow metal lines to form electrical contact with the vias 214 in the via-containing layer 210. The second conductive lines 230B have a width ranging from about 10 nm to about 20 nm and a space ranging from about 10 nm to about 20 nm. The first conductive line 230A includes a glue portion 222P, a conductive portion 224P, and a conductive cap 226P. Each of the second conductive lines 230B includes a glue portion 222P and a conductive portion 224P.

In the semiconductor structure 200 and the semiconductor structure 300 of the present disclosure, by introducing additional conductive cap 226P only in the first conductive line 230A to compensate the height difference between conductive lines 230A, 230B overlying respective low surface portion 210A and the high surface portion 210B of the via-containing layer 210, the air gap punch through caused by the uneven topography of the underlying layer during planarizing the overlying air gap-containing dielectric layer 240 is prevented. This additional topography reset methodology helps to improve the reliability of the integrated circuits. The different martial choice for the conductive cap 226P versus the conductive portion 224P also allows to improve electrical property of the first conductive line 230A.

Figure 4:
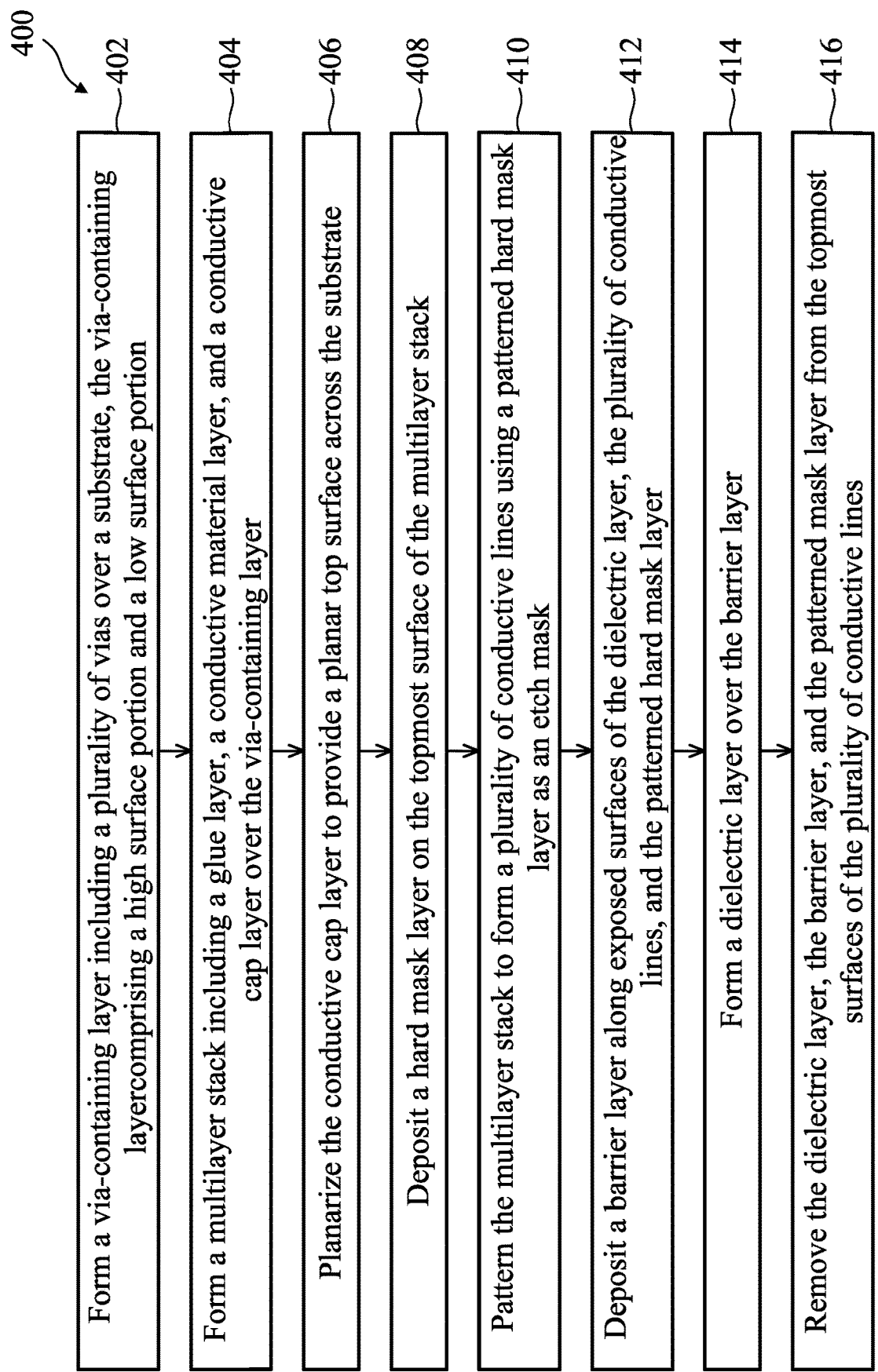
FIG. 4 is a flowchart of a method for fabricating a semiconductor structure, in accordance with some embodiments.

FIG. 4 is a flowchart of a method 400 for fabricating a semiconductor structure 500, in accordance with some embodiments. FIGS. 5A-5H are cross-sectional views of the semiconductor structure 500 in various stages of the method 400, in accordance with some embodiments. The method 400 is discussed in detail below, with reference to the semiconductor structure 500, in FIGS. 5A-5H. In some embodiments, additional operations are performed before, during, and/or after the method 400, or some of the operations described are replaced and/or eliminated. In some embodiments, additional features are added to the semiconductor structure 500. In some embodiments, some of the features described below are replaced or eliminated. One of ordinary skill in the art would understand that although some embodiments are discussed with operations performed in a particular order, these operations may be performed in another logical order. Components in the semiconductor structure 500 that are the same or similar to the semiconductor structure 200 are given the same references numbers, and detailed description thereof is thus omitted.

Figure 5A:
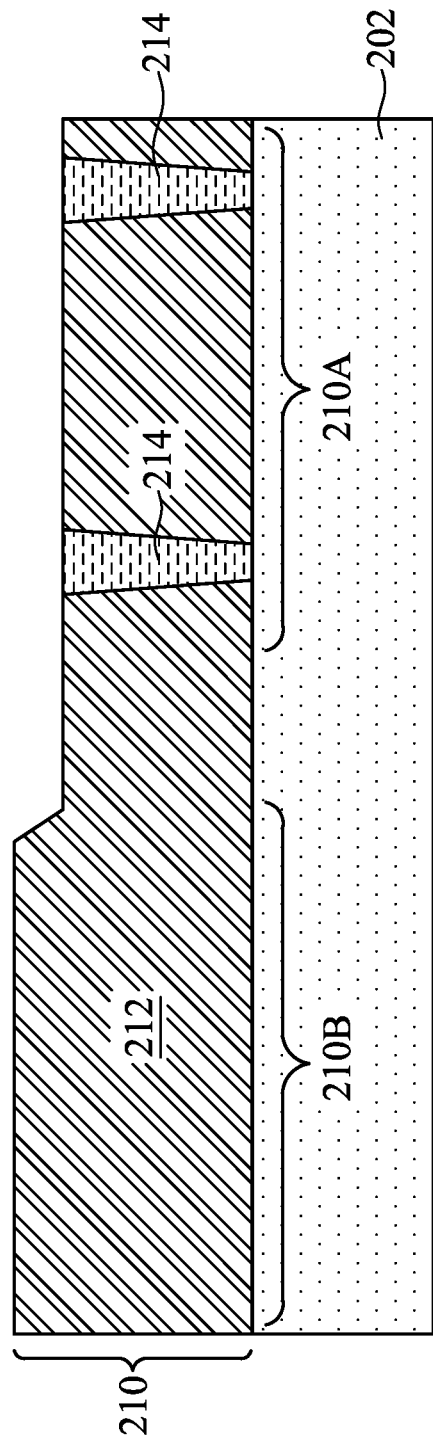
FIGS. 5A-5H are cross-sectional views of a first exemplary semiconductor structure during various stages of the method of FIG. 4, in accordance with some embodiments.

Referring to FIGS. 4 and 5A, the method 400 includes operation 402, in which a via-containing layer 210 is formed over a substrate 202. FIG. 5A is a cross-sectional view of an initial semiconductor structure after forming the via-containing layer 210 over the substrate 202, in accordance with some embodiments. The via-containing layer 210 includes a dielectric layer 212 and a plurality of vias 214 formed in the dielectric layer 212. As shown in FIG. 5A, the via-containing layer 210 has a stepped topography including a low surface portion 210A and a high surface portion 210B. The vias 214 are located in the low surface portion 210A of the via-containing layer 210. The via-containing layer 210 is formed by fabrication processes described above in FIG. 2A.

Figure 5B:
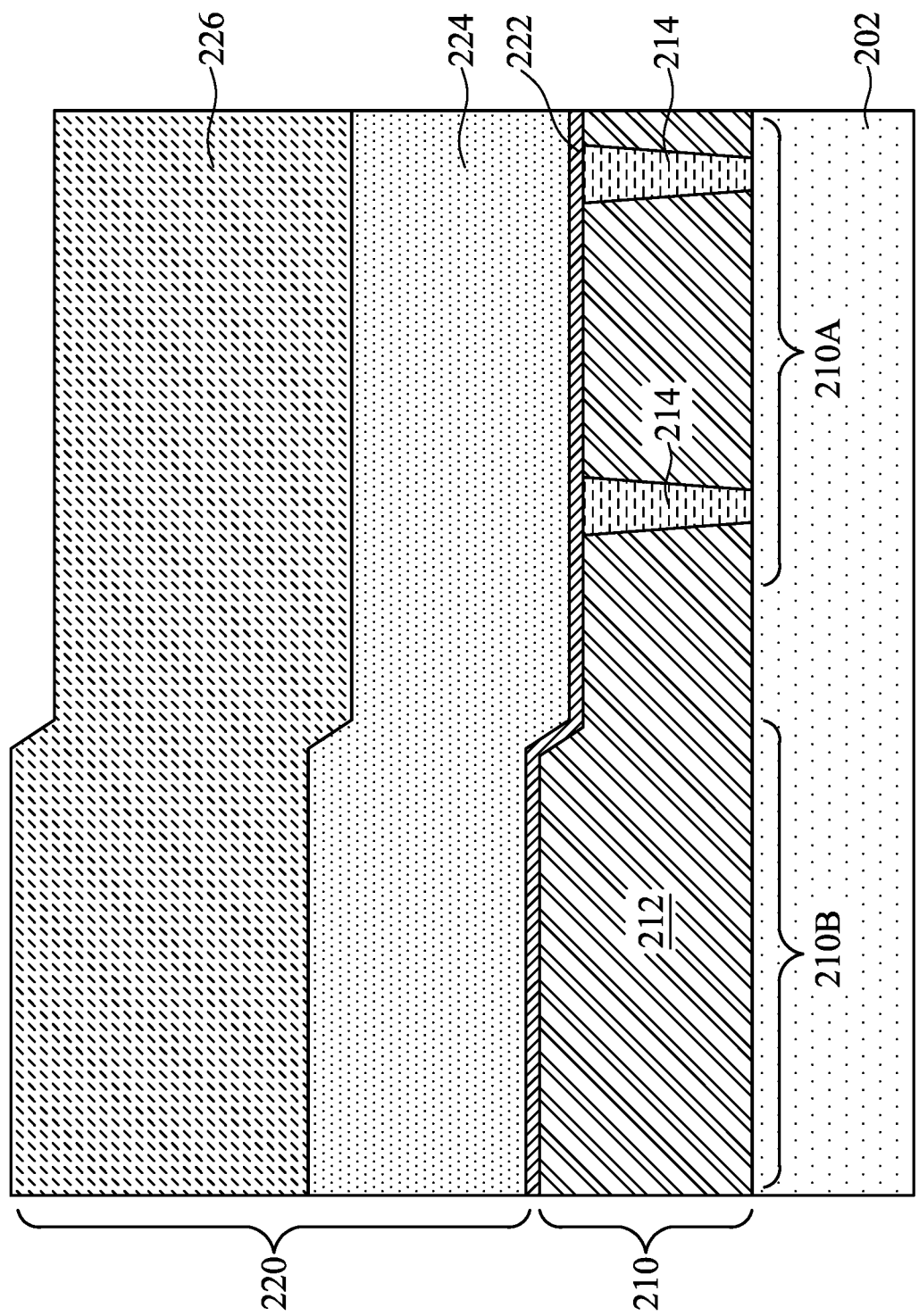

Referring to FIG. 4 and FIG. 5B, the method 400 proceeds to operation 404, in which a multilayer stack 220 including a glue layer 222, a conductive material layer 224, and a conductive cap layer 226 is formed on the via-containing layer 210. Each of the glue layer 222, the conductive material layer 224 and the conductive cap layer 226 is formed by a conformal deposition process described above in FIG. 2B. Each of the glue layer 222, the conductive material layer 224 and the conductive cap layer 226 thus conforms to the stepped topography of the underlying via-containing layer 210, resulting a low surface portion and a high surface portion thereof.

Figure 5C:
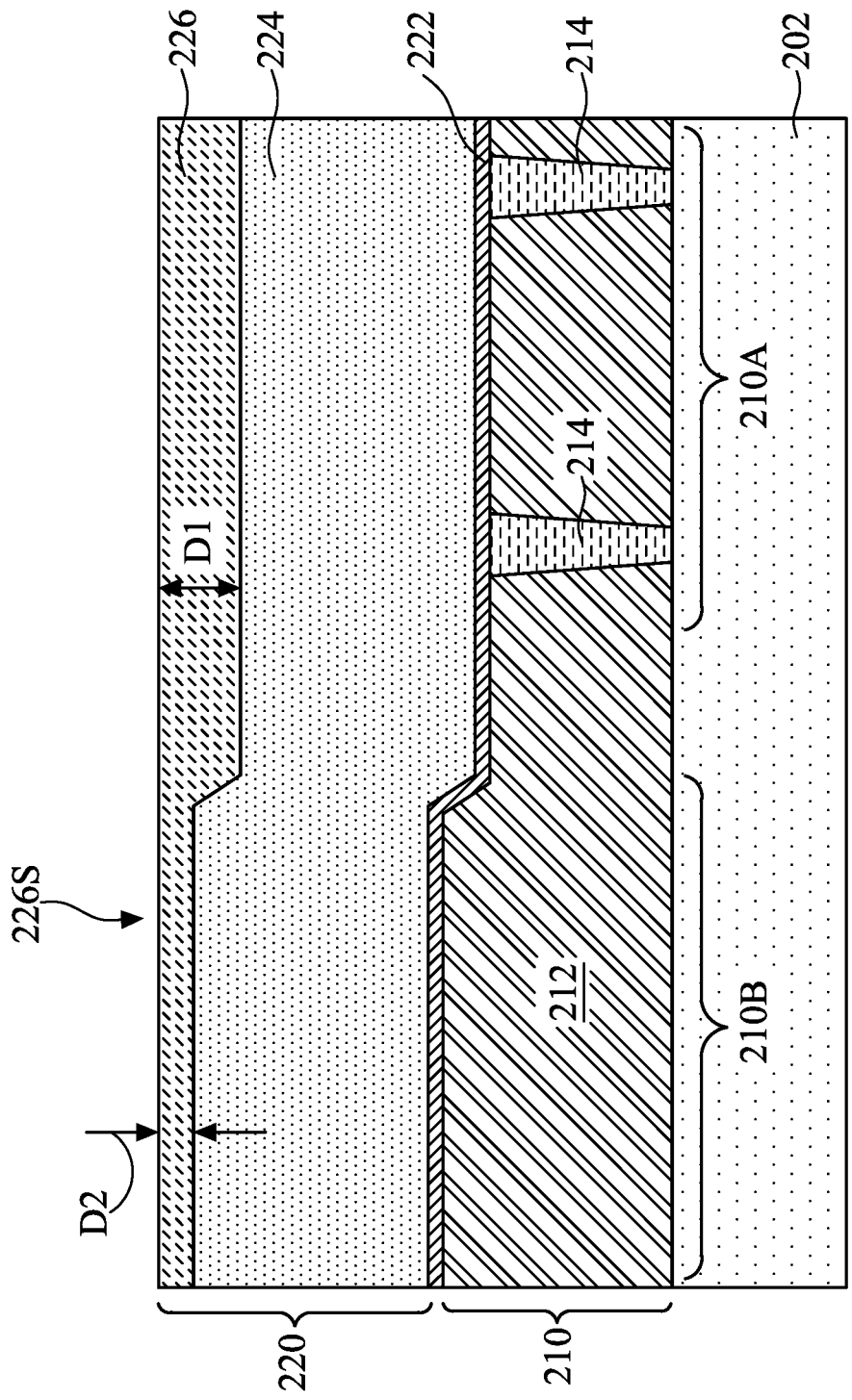

Referring to FIG. 4 and FIG. 5C, the method 400 proceeds to operation 406, in which the top surface of the conductive cap layer 226 is planarized to form a planar top surface 226S. FIG. 5C is a cross-sectional view of the semiconductor structure of FIG. 5B after planarizing the conductive cap layer 226 to form the planar top surface 226S, in accordance with some embodiments.

In some embodiments, a CMP process is performed to planarize the conductive cap layer 226. Planarizing the conductive cap layer 226 using CMP generates a substantially flat contiguous surface, i.e., the planar top surface 226S, across the substrate 202. After CMP, a portion of the conductive cap layer 226 overlying the low surface portion 210A of the via-containing layer 210 has a thickness D1 ranging from about 10 Å to about 60 Å, while a portion of the conductive cap layer 226 overlying the high surface portion 210B of the via-containing layer 210 has a thickness D2 ranging from about 5 Å to about 30 Å. The conditions of the CMP process are described above in FIG. 2C.

Figure 5D:
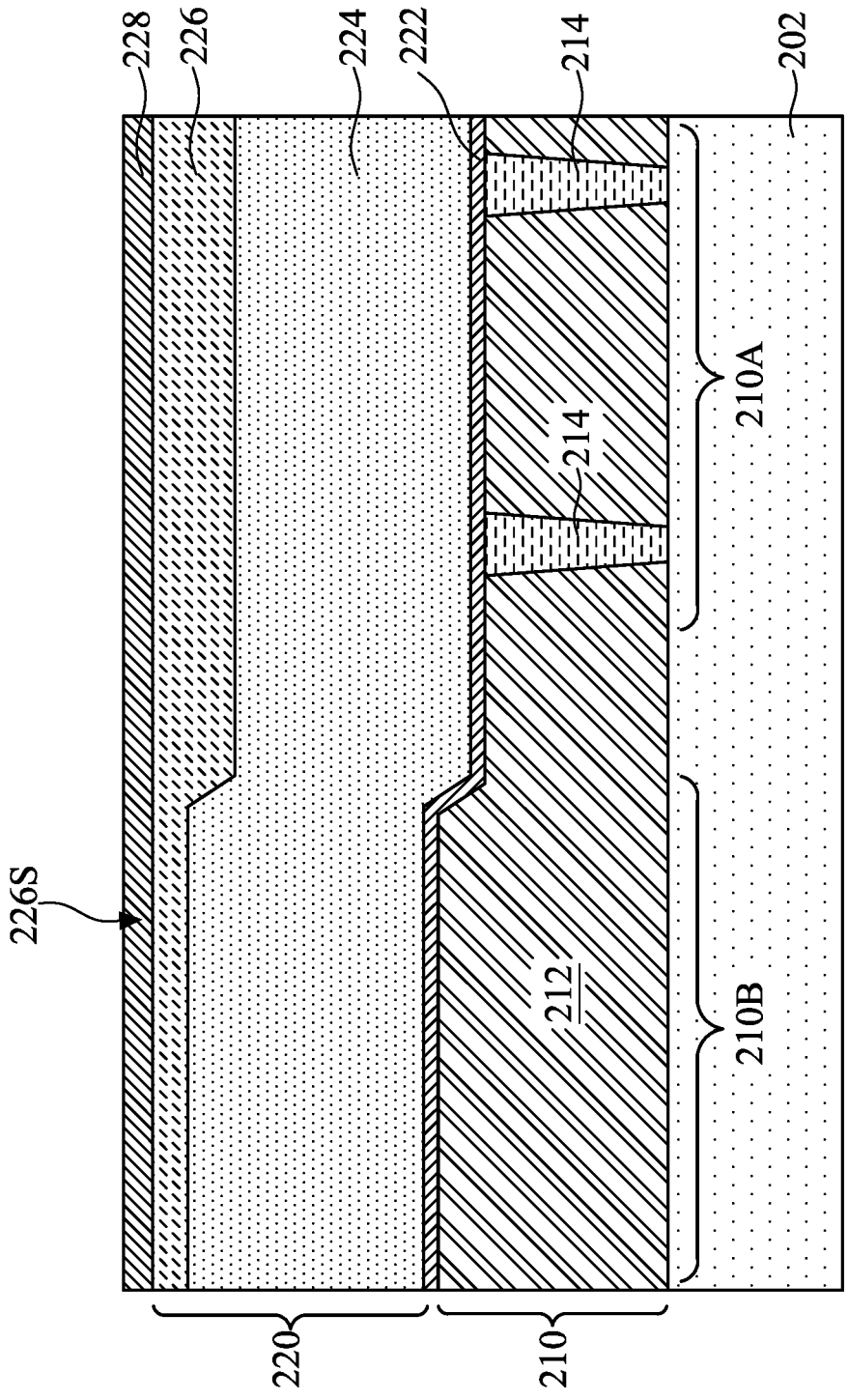

Referring to FIG. 4 and FIG. 5D, the method 400 proceeds to operation 408, in which a hard mask layer 228 is deposited on the topmost surface of the multilayer stack 220. FIG. 5D is a cross-sectional view of the semiconductor structure of FIG. 5C after depositing the hard mask layer 228 on the topmost surface of the multilayer stack 220, in accordance with some embodiments.

The hard mask layer 228 is disposed on the planar top surface 226S of the conductive cap layer 226. The material and fabrication of the hard mask layer 228 are described above in FIG. 2D.

Figure 5E:
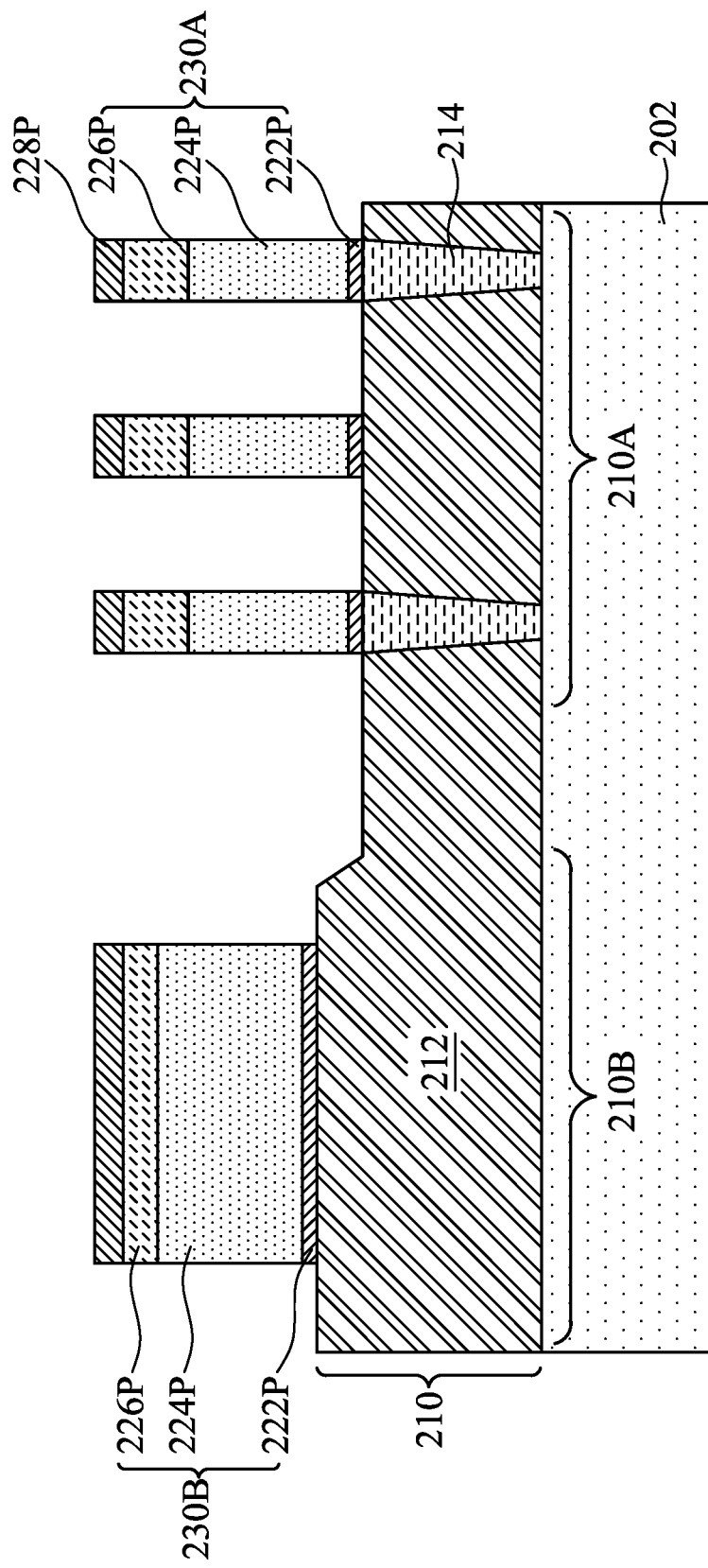

Referring to FIG. 4 and FIG. 5E, the method 400 proceeds to operation 410, in which the multilayer stack 220 is patterned to form a plurality of conductive lines 230A, 230B. FIG. 5E is a cross-sectional view of the semiconductor structure of FIG. 5D after patterning the multilayer stack 220 to form the plurality of conductive lines, in accordance with some embodiments.

The conductive lines 230A, 230B includes a plurality of first conductive lines 230A located above the low surface portion 210A of the via-containing layer 210 and one or more second conductive lines 230B located above the high surface portion 210B of the via-containing layer 210. For simplicity, three first conductive lines 230A and a single second conductive line 230B are illustrated in FIG. 5E. The first conductive lines 230A are formed as narrow metal lines with a line width ranging from about 10 nm to about 20 nm and a line spacing ranging from about 10 nm to about 20 nm. The first conductive lines 230A contact respective vias 214 in the via-containing layer 210. The second conductive line 230B is formed as a wide metal line having a line width ranging from about 40 nm to about 1 µm. Each of the first and second conductive lines 230A, 230B includes, from bottom to top, a glue portion 222P, a conductive portion 224P, and a conductive cap 226P. However, as a result of the stepped topography of the underlying via-containing layer 210, the conductive cap 226P in each first conductive line 230A has a thickness greater than the thickness of the conductive cap 226P in the second conductive line 230B. The greater thickness of the conductive cap 226P in the first conductive line 230A compensates the height difference between the first and second conductive lines 230A, 230B due to the presence of the low surface portion 210A and the high surface portion 210B in the via-containing layer 210. As a result, the topmost surface of the first conductive line 230A is coplanar with the topmost surface of the second conductive line 230B.

The first and second conductive lines 230A, 230B are formed by first etching the hard mask layer 228 to provide a patterned hard mask layer 228P, and then etching the conductive cap layer 226, the conductive material layer 224, and the glue layer 222 in the multilayer stack 220 using the patterned hard mask layer 228P as an etch mask. The hard mask layer 228 and the multilayer stack 220 are etching using processes described above in FIG. 2E. In some embodiments and as in FIG. 5E, the conductive lines 230A, 230B are formed with substantially vertical sidewalls. In other embodiments, the conductive lines 230A, 230B are formed with sloped sidewalls (not shown). In some embodiments, the width at the top of the conductive lines 230A, 230B is larger than the width at the base of the conductive lines 230A, 230B.

Figure 5F:
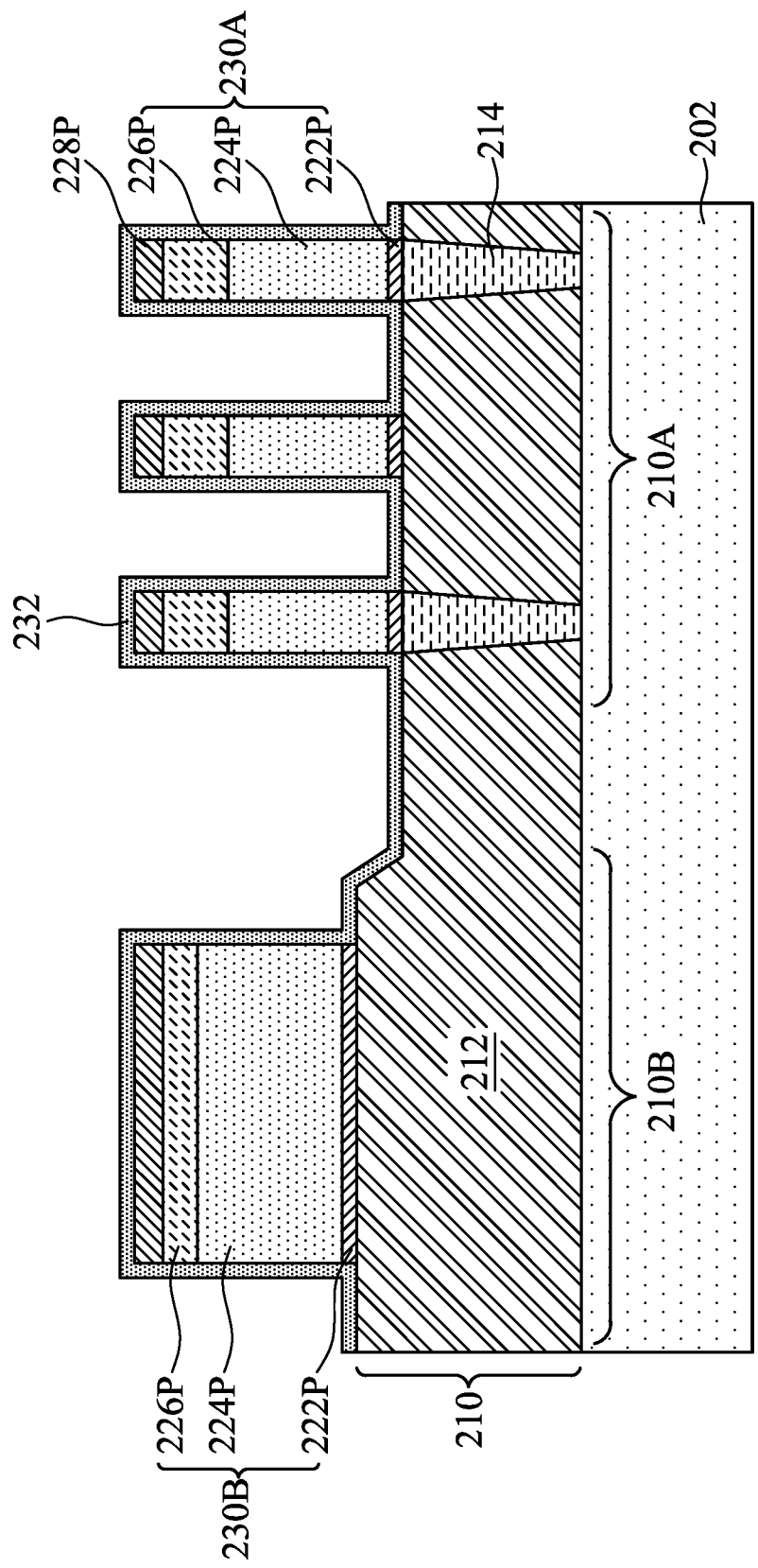

Referring to FIG. 4 and FIG. 5F, the method 400 proceeds to operation 412, in which a barrier layer 232 is deposited along exposed surfaces of the dielectric layer 212, the first and second conductive lines 230A, 230B, and the patterned hard mask layer 228P. FIG. 5F is a cross-sectional view of the semiconductor structure of FIG. 5E after depositing the barrier layer 232 along the exposed surfaces of the dielectric layer 212, the first and second conductive lines 230A, 230B, and the patterned hard mask layer 228P, in accordance with some embodiments. The barrier layer 232 contacts sidewalls of the glue portions 222P, the conductive portions 224P, and the conductive caps 226P. The material and deposition of the barrier layer 232 are described above in FIG. 2F.

Figure 5G:
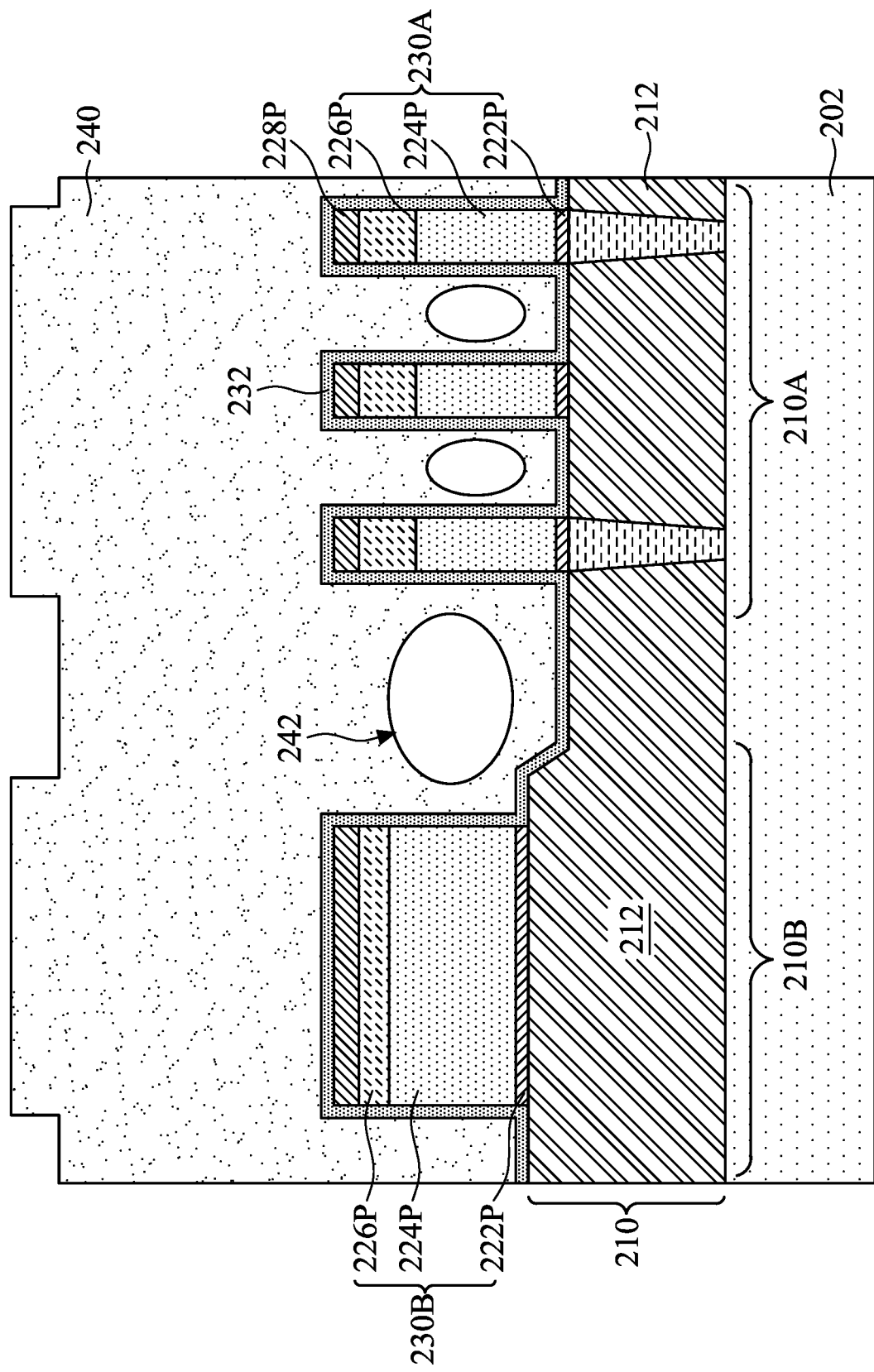

Referring to FIG. 4 and FIG. 5G, the method 400 proceeds to operation 414, in which a dielectric layer 240 is deposited over the barrier layer 232. FIG. 5G is a cross-sectional view of the semiconductor structure of FIG. 5F after depositing the dielectric layer 240 over the barrier layer 232, in accordance with some embodiments. The dielectric layer 240 contains air gaps 242 between first and second conductive lines 230A, 230B. The material and deposition of the dielectric layer 240 are described above in FIG. 2G.

Figure 5H:
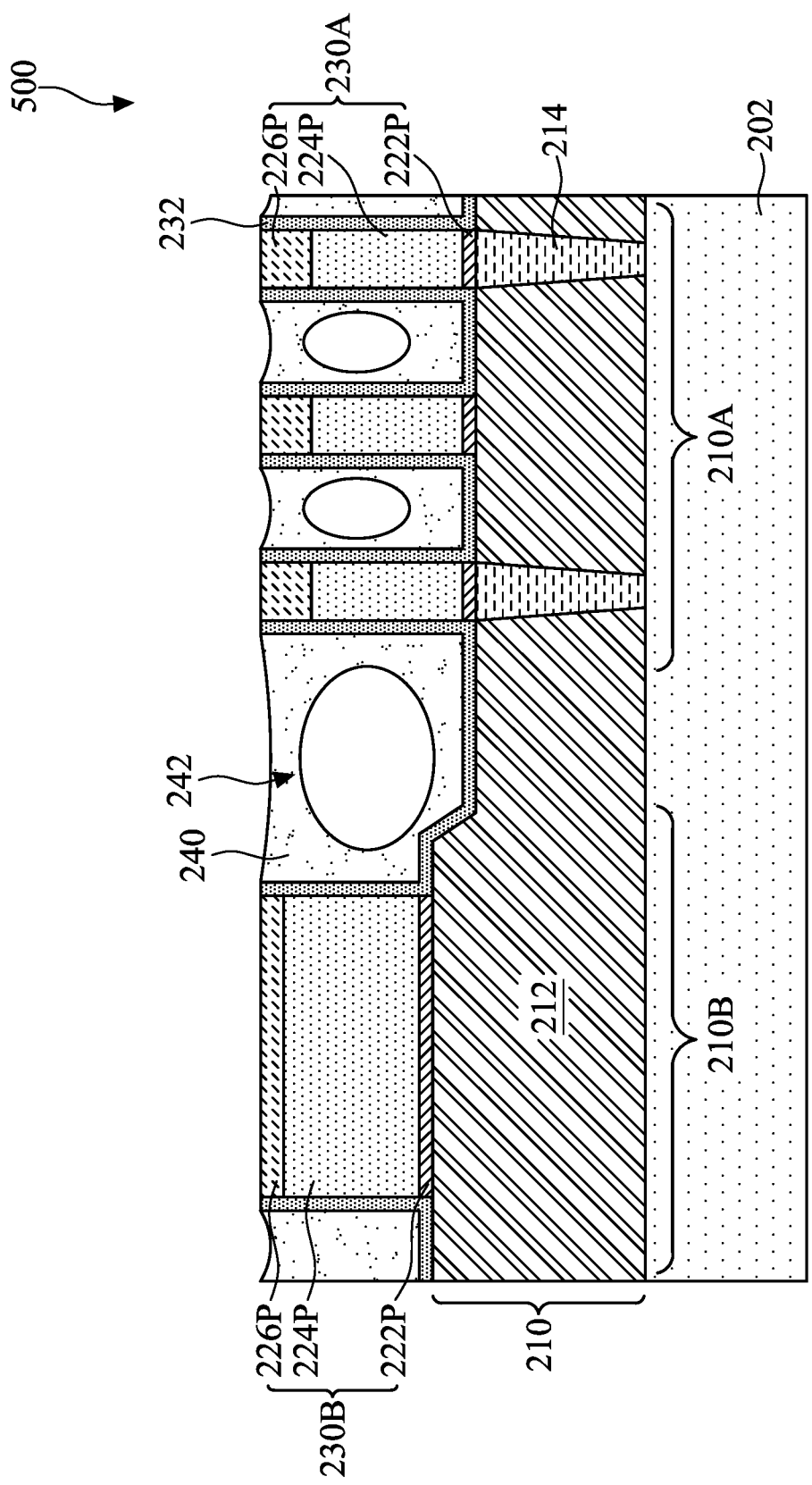

Referring to FIG. 4 and FIG. 5H, the method 400 proceeds to operation 416, in which the dielectric layer 240, the barrier layer 232, and the patterned hard mask layer 228P are removed from the topmost surfaces of the first and second conductive lines 230A, 230B. FIG. 5H is a cross-sectional view of the semiconductor structure of FIG. 5G after removing the dielectric layer 240, the barrier layer 232, and the patterned hard mask layer 228P from the topmost surfaces of the first and second conductive lines 230A, 230B, in accordance with some embodiments.

The removal of the dielectric layer 240, the barrier layer 232, and the patterned hard mask layer 228P from the topmost surfaces of the first and second conductive lines 230A, 230B can be implemented by one or more CMP processes described above in FIG. 2H. After CMP, the top surface of the dielectric layer 240 and the barrier layer 232 are substantially coplanar with the topmost surfaces of the first and second conductive lines 230A, 230B (i.e., the top surfaces of the conductive caps 226P). The top surfaces of the conductive caps 226P are exposed.

Figure 6:
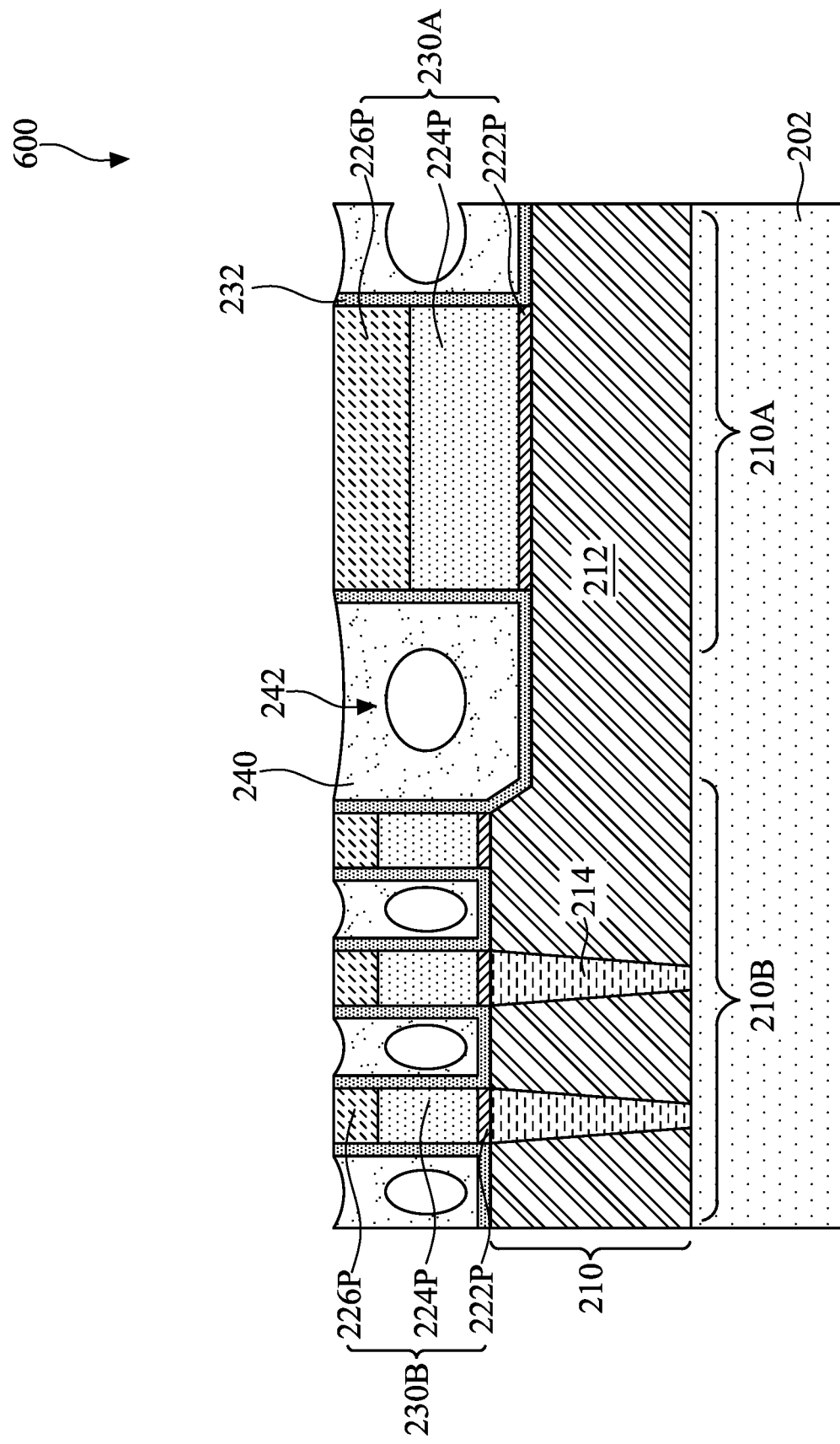
FIG. 6 is a cross-sectional view of a second exemplary semiconductor structure obtained using the method of FIG. 4, in accordance with some embodiments.

FIG. 6 is a cross-sectional view of a semiconductor structure 600 that can be formed by performing the method 400, in accordance with some embodiments. Components in the semiconductor structure 600 that are the same or similar to the semiconductor structure 500 are given the same references numbers, and detailed description thereof is thus omitted.

Referring to FIG. 6, the semiconductor structure 600 includes a substrate 202, a via-containing layer 210 comprising a plurality of vias 214 over the substrate, and a metallization layer comprising a dielectric layer 240 and a plurality of conductive lines 230A, 230B formed therein. Air gaps 242 are formed between adjacent conductive lines 230A, 230B. A barrier layer 232 is present on sidewalls of the conductive lines 230A, 230B to prevent the conductive metal(s) in the conductive portions 224P and conductive caps 226P from diffusing into the dielectric layer 240.

Unlike the semiconductor structure 500 in which the vias 214 in the via-containing layer 210 are located in the low surface portion 210A of the via-containing layer 210, in the semiconductor structure 600, the vias 214 are located in the high surface portion 210B of the via-containing layer 210 according to a different circuit design. Accordingly, in the semiconductor structure 600, the plurality of conductive lines includes a first conductive line 230A overlying the low surface portion 210A of the via-containing layer 210 and a plurality of second conductive lines 230B overlying the high surface portion 210B of the via-containing layer 210. The first conductive line 230A is formed as a wide metal line having a line width ranging from about 40 nm to about 1 µm. The second conductive lines 230B are formed as narrow metal lines to form electrical contact with the vias 214 in the via-containing layer 210. The second conductive lines 230B have a width ranging from about 10 nm to about 20 nm and a space ranging from about 10 nm to about 20 nm. Each of the first conductive line 230A includes a glue portion 222P, a conductive portion 224P, and a conductive cap 226P. The conductive cap 226P in the first conductive line 230A has a thickness greater than the thickness of the conductive cap 226P in each second conductive line 230B.

In the semiconductor structure 500 and the semiconductor structure 600 of the present disclosure, by introducing a conductive cap 226P in both first and second conductive lines 230A, 230B to compensate the height difference between the first and second conductive lines 230A, 230B due to the presence of the low surface portion 210A and the high surface portion 210B of the via-containing layer 210, the air gap punch through caused by the uneven topography of the underlying layer during planarizing the overlying air gap-containing dielectric layer 240 is prevented. This additional topography reset methodology helps to improve the reliability of the integrated circuits. The different martial choice for the conductive cap 226P versus the conductive portion 224P also allows to improve electrical property of the first and second conductive lines 230A, 230B.

Figure 7:
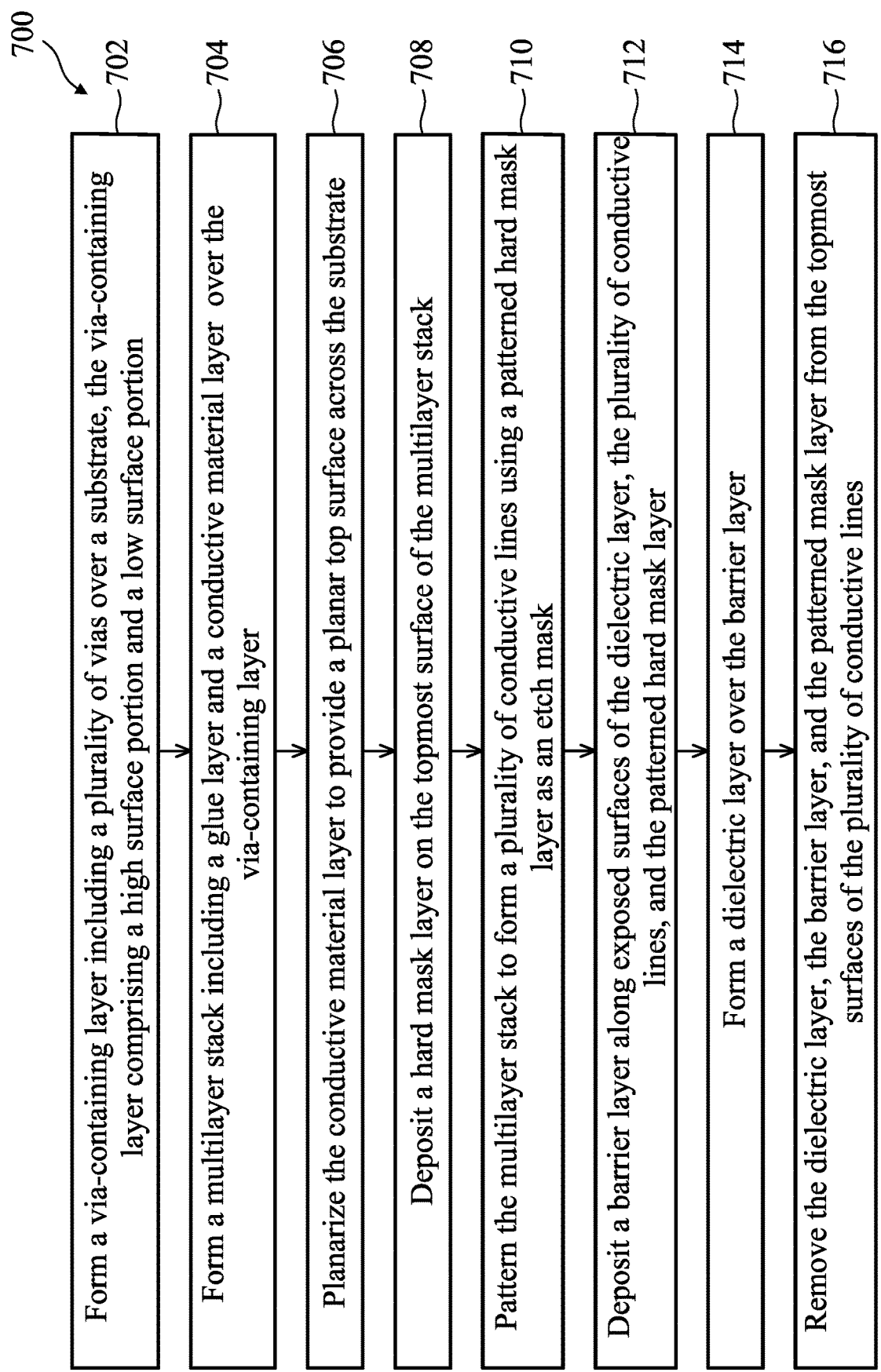
FIG. 7 is a flowchart of a method for fabricating a semiconductor structure, in accordance with some embodiments.

FIG. 7 is a flowchart of a method 700 for fabricating a semiconductor structure 800, in accordance with some embodiments. FIGS. 8A-8H are cross-sectional views of the semiconductor structure 800 in various stages of the method 700, in accordance with some embodiments. The method 700 is discussed in detail below, with reference to the semiconductor structure 800, in FIGS. 8A-8H. In some embodiments, additional operations are performed before, during, and/or after the method 700, or some of the operations described are replaced and/or eliminated. In some embodiments, additional features are added to the semiconductor structure 800. In some embodiments, some of the features described below are replaced or eliminated. One of ordinary skill in the art would understand that although some embodiments are discussed with operations performed in a particular order, these operations may be performed in another logical order. Components in the semiconductor structure 800 that are the same or similar to the semiconductor structure 200 are given the same references numbers, and detailed description thereof is thus omitted.

Figure 8A:
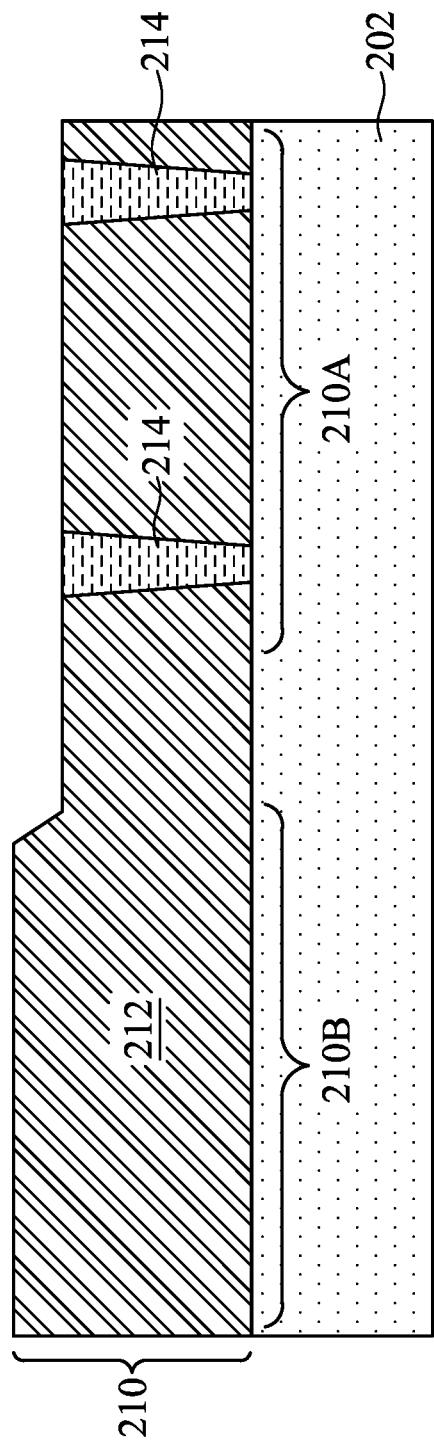
FIGS. 8A-8H are cross-sectional views of an exemplary semiconductor structure during various stages of the method of FIG. 7, in accordance with some embodiments.

Referring to FIGS. 7 and 8A, the method 700 includes operation 702, in which a via-containing layer 210 is formed over a substrate 202. FIG. 8A is a cross-sectional view of an initial semiconductor structure after forming the via-containing layer 210 over the substrate 202, in accordance with some embodiments. The via-containing layer 210 includes a dielectric layer 212 and a plurality of vias 214 formed in the dielectric layer 212. As shown in FIG. 8A, the via-containing layer 210 has a stepped topography including a low surface portion 210A and a high surface portion 210B. The vias 214 are located in the low surface portion 210A of the via-containing layer 210. The via-containing layer 210 is formed by fabrication processes described above in FIG. 2A.

Figure 8B:
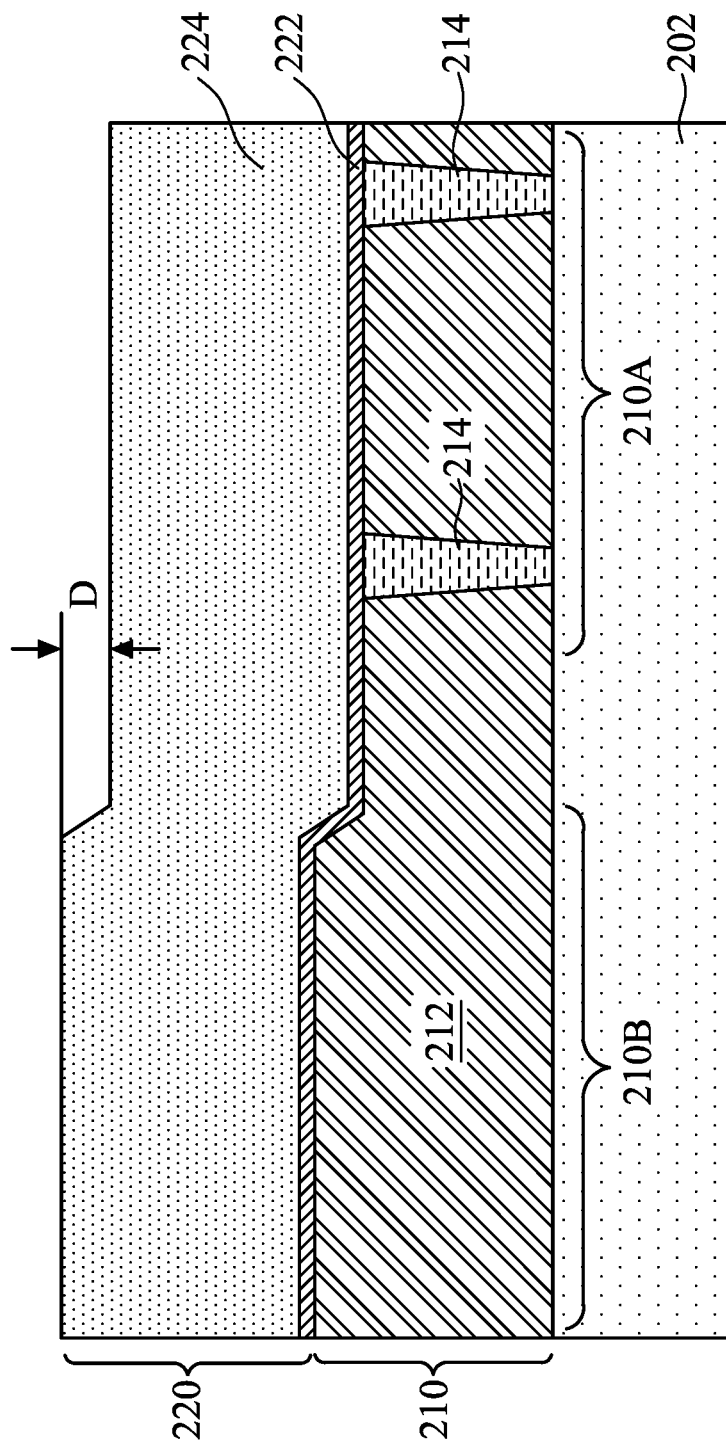
Figure 8C:
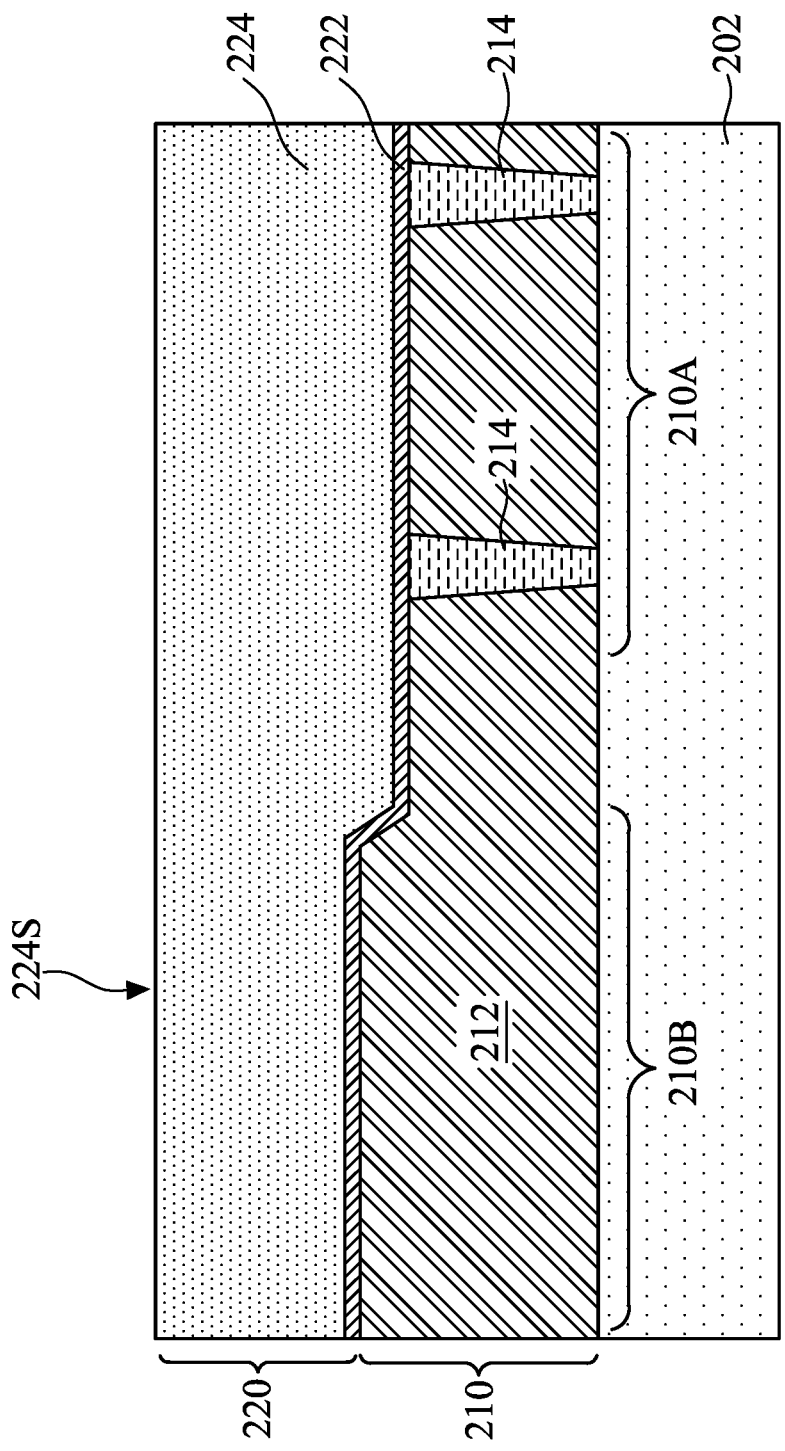

Referring to FIG. 7 and FIG. 8B, the method 700 proceeds to operation 704, in which a multilayer stack 220 including a glue layer 222 and a conductive material layer 224 is formed on the via-containing layer 210. Each of the glue layer 222 and the conductive material layer 224 is formed by a conformal deposition process described above in FIG. 2B. Each of the glue layer 222 and the conductive material layer 224 thus conforms to the stepped topography of the underlying via-containing layer 210, resulting in a low surface portion and a high surface portion thereof. The step height D between the low surface portion and the high surface portion of the conductive material layer 224 is from about 1 Å to about 10 Å. Unlike the semiconductor structure of FIG. 2B, no conductive cap layer is provided in the multilayer stack 220 in FIG. 8B Referring to FIG. 7 and FIG. 8C, the method 700 proceeds to operation 706, in which the top surface of the conductive material layer 224 is planarized to form a planar top surface 224S. FIG. 8C is a cross-sectional view of the semiconductor structure of FIG. 8B after planarizing the conductive material layer 224 to form the planar top surface 224S, in accordance with some embodiments.

In some embodiments, a CMP process is performed to planarize the conductive material layer 224. Planarizing the conductive material layer 224 using CMP generates a substantially flat contiguous surface, i.e., the planar top surface 224S, across the substrate 202. The conditions of the CMP process are described above in FIG. 2C.

Figure 8D:
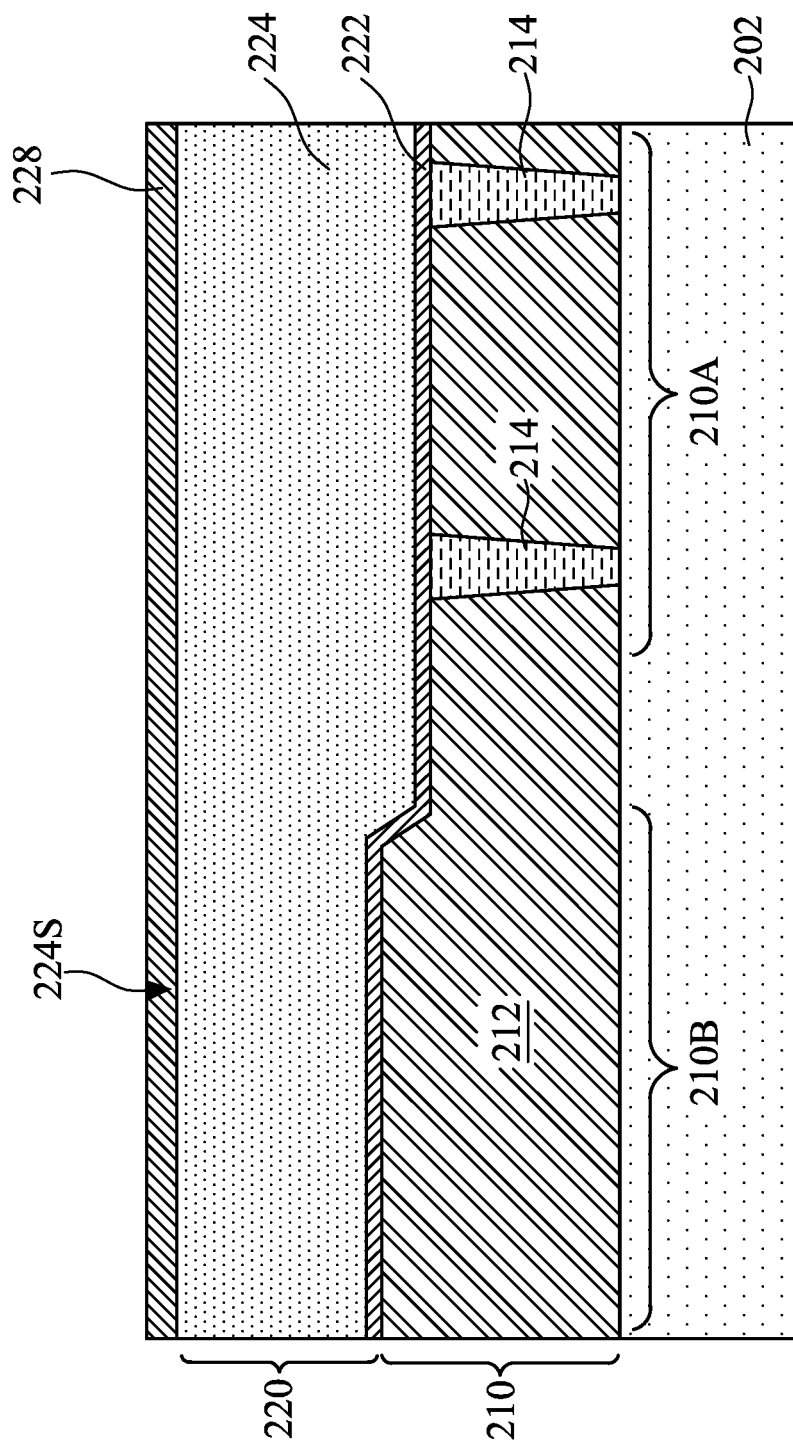

Referring to FIG. 7 and FIG. 8D, the method 700 proceeds to operation 708, in which a hard mask layer 228 is deposited on the topmost surface of the multilayer stack 220. FIG. 8D is a cross-sectional view of the semiconductor structure of FIG. 8C after depositing the hard mask layer 228 on the topmost surface of the multilayer stack 220, in accordance with some embodiments.

The hard mask layer 228 is disposed on the planar top surface 224S of the conductive material layer 224. The material and deposition of the hard mask layer 228 are described above in FIG. 2D.

Figure 8E:
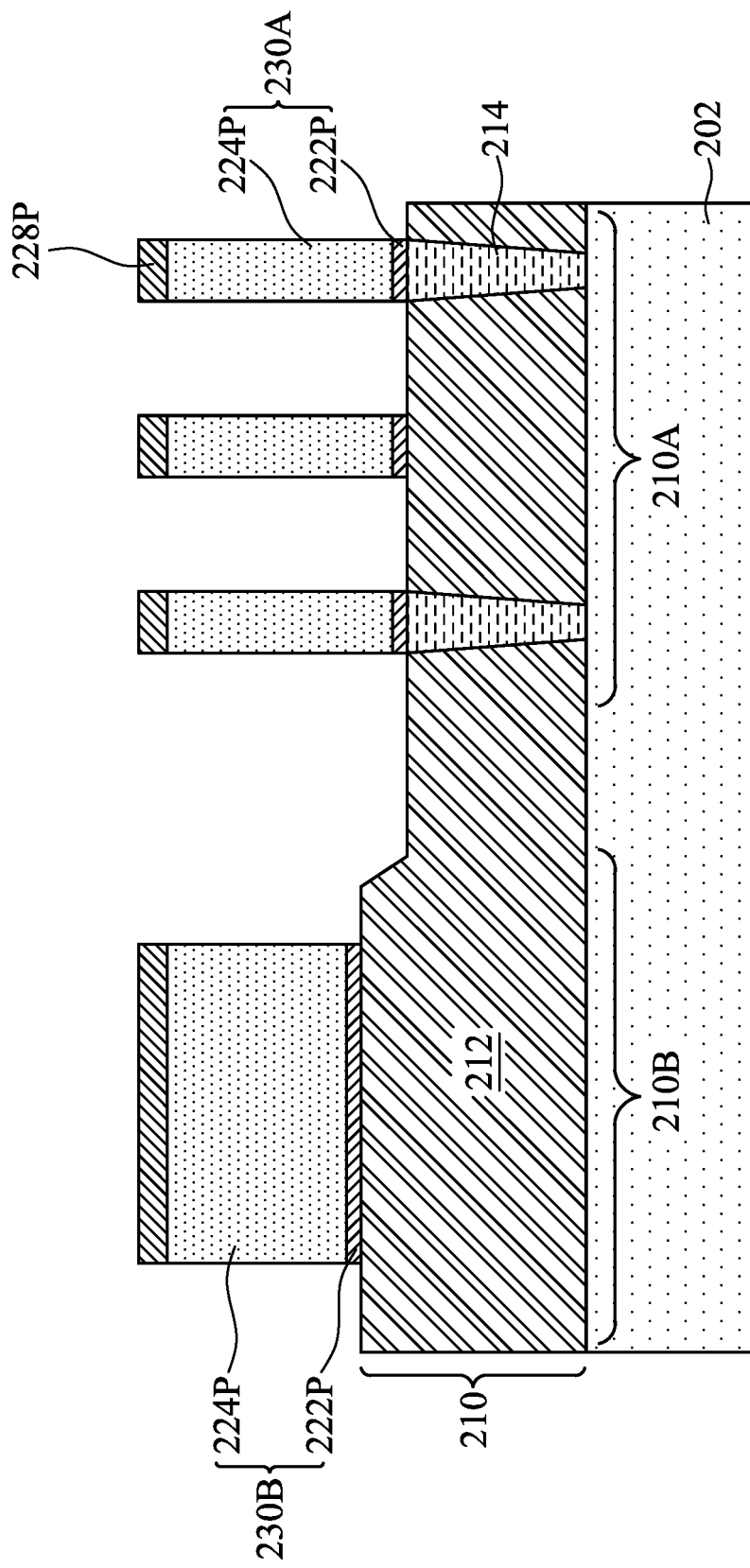

Referring to FIG. 7 and FIG. 8E, the method 700 proceeds to operation 710, in which the multilayer stack 220 is patterned to form a plurality of conductive lines 230A, 230B. FIG. 8E is a cross-sectional view of the semiconductor structure of FIG. 8D after patterning the multilayer stack 220 to form the plurality of conductive lines, in accordance with some embodiments.

The conductive lines 230A, 230B includes a plurality of first conductive lines 230A located above the low surface portion 210A of the via-containing layer 210 and one or more second conductive lines 230B located above the high surface portion 210B of the via-containing layer 210. For simplicity, three first conductive lines 230A and a single second conductive line 230B are illustrated in FIG. 8E. The first conductive lines 230A are formed as narrow metal lines with a line width ranging from about 10 nm to about 20 nm and a line spacing ranging from about 10 nm to about 20 nm. The first conductive lines 230A contacts the vias 214 in the via-containing layer 210. The second conductive line 230B is formed as a wide metal line having a line width ranging from about 40 nm to about 1 µm. Each of the first and second conductive lines 230A includes, from bottom to top, a glue portion 222P and a conductive portion 224P. However, as a result of the step topography of the underlying via-containing layer 210, the conductive portion 224P in each first conductive line 230A has a thickness greater than the thickness of the conductive portion 224P in the second conductive line 230B. The greater thickness of the conductive portion 224P in the first conductive line 230A compensates the height difference between the first and second conductive lines 230A, 230B due to the presence of the low surface portion 210A and the high surface portion 210B in the via-containing layer 210. As a result, the topmost surface of the first conductive line 230A is coplanar with the topmost surface of the second conductive line 230B.

The first and second conductive lines 230A, 230B are formed by first etching the hard mask layer 228 to provide a patterned hard mask layer 228P, and then etching the conductive material layer 224 and the glue layer 222 of the multilayer stack 220 using the patterned hard mask layer 228P as an etch mask. The hard mask layer 228 and the multilayer stack 220 are etching using processes described above in FIG. 2E. In some embodiments and as in FIG. 8E, the conductive lines 230A, 230B are formed with substantially vertical sidewalls. In other embodiments, the conductive lines 230A, 230B are formed with sloped sidewalls (not shown). In some embodiments, the width at the top of the conductive lines 230A, 230B is larger than the width at the base of the conductive lines 230A, 230B.

Figure 8F:
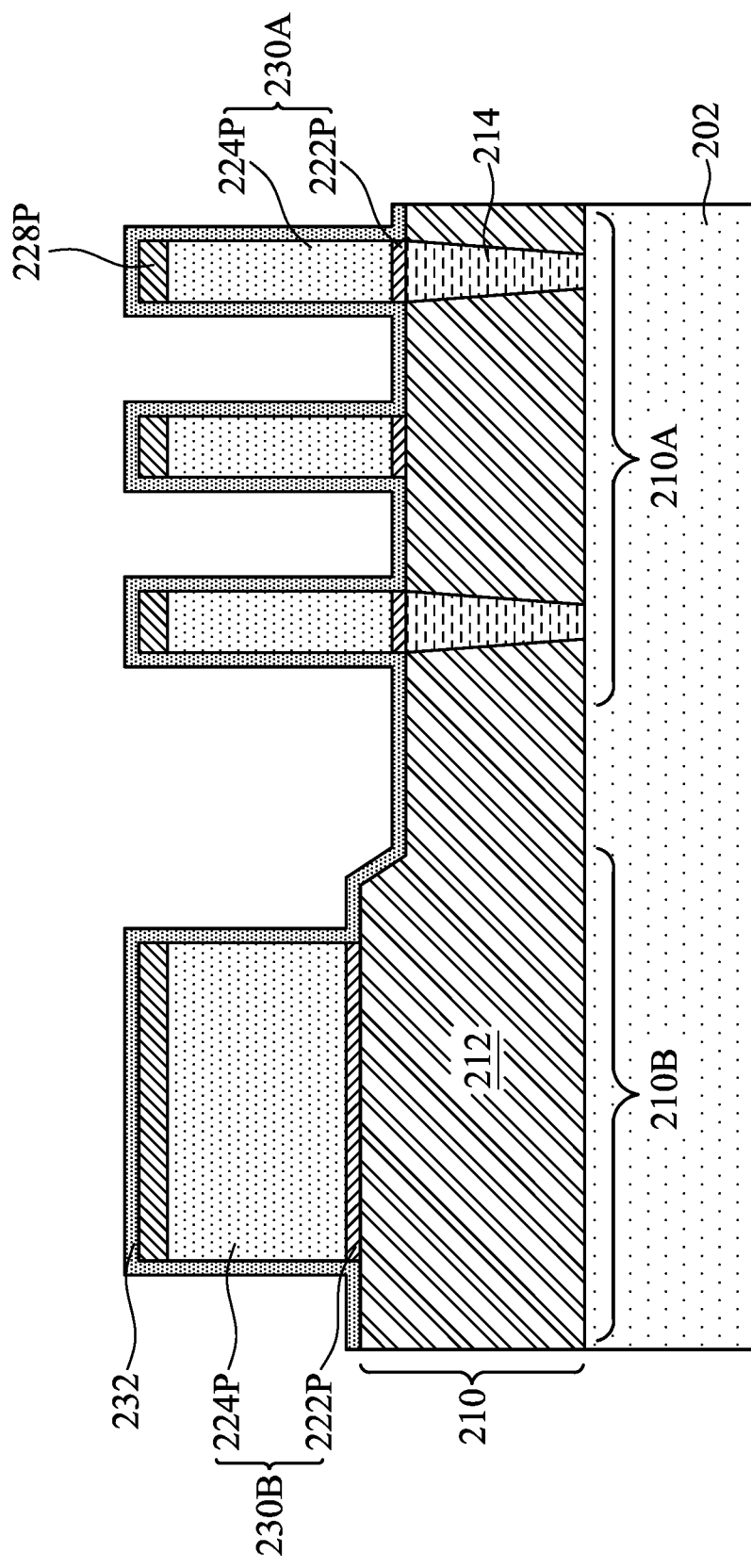

Referring to FIG. 7 and FIG. 8F, the method 700 proceeds to operation 712, in which a barrier layer 232 is deposited along exposed surfaces of the dielectric layer 212, the first and second conductive lines 230A, 230B, and the patterned hard mask layer 228P. FIG. 8F is a cross-sectional view of the semiconductor structure of FIG. 8E after depositing the barrier layer 232 along the exposed surfaces of the dielectric layer 212, the first and second conductive lines 230A, 230B, and the patterned hard mask layer 228P, in accordance with some embodiments. The barrier layer 232 contacts sidewalls of the glue portions 222P and the conductive portions 224P. The material and deposition of the barrier layer 232 are described above in FIG. 2F.

Figure 8G:
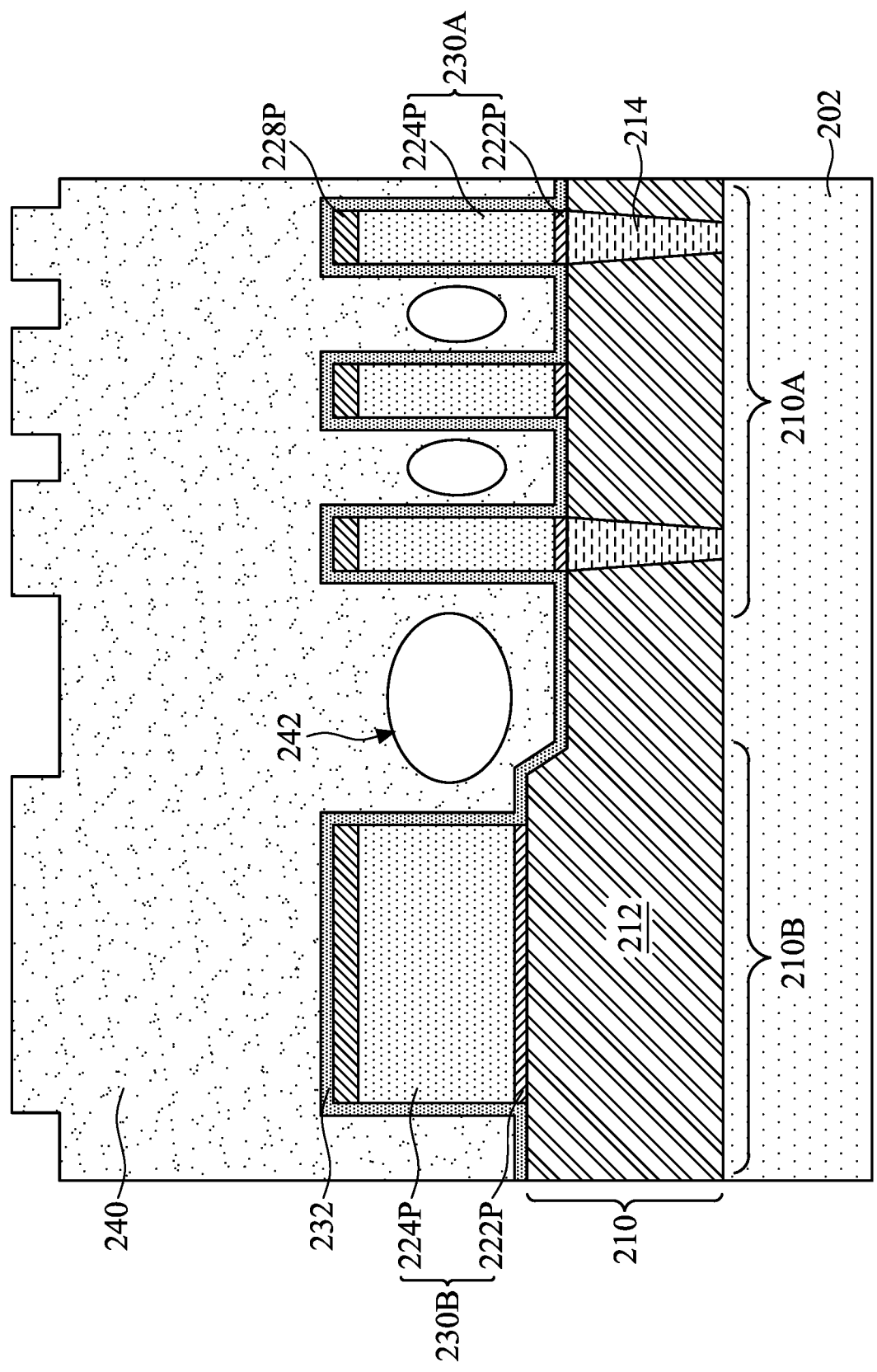

Referring to FIG. 7 and FIG. 8G, the method 700 proceeds to operation 714, in which a dielectric layer 240 is deposited over the barrier layer 232. FIG. 8G is a cross-sectional view of the semiconductor structure of FIG. 8F after depositing the dielectric layer 240 over the barrier layer 232, in accordance with some embodiments. The dielectric layer 240 contains air gaps 242 between adjacent first and second conductive lines 230A, 230B. The material and deposition of the dielectric layer 240 are described above in FIG. 2G.

Figure 8H:
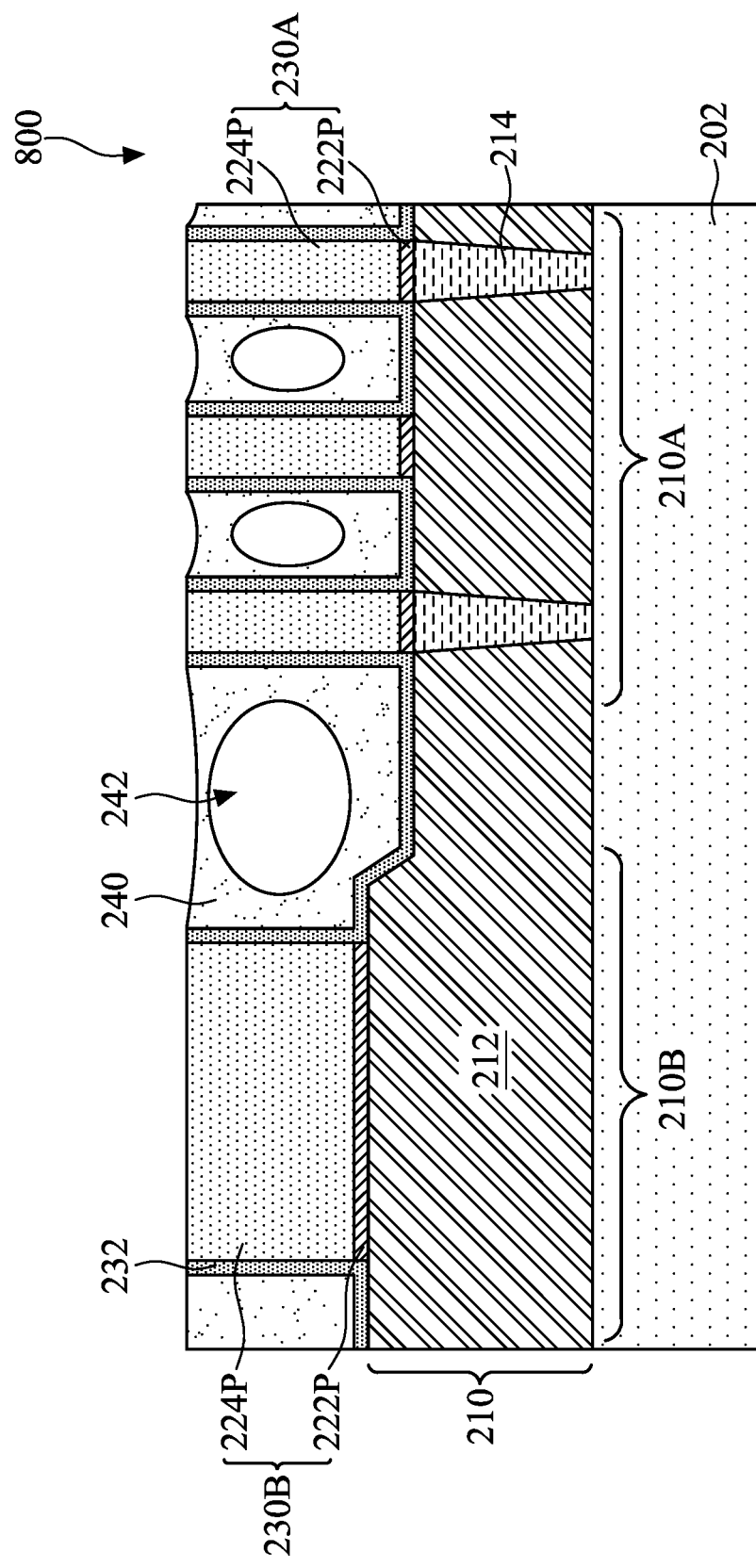

Referring to FIG. 7 and FIG. 8H, the method 700 proceeds to operation 716, in which the dielectric layer 240, the barrier layer 232, and the patterned hard mask layer 228P are removed from the topmost surfaces of the first and second conductive lines 230A, 230B. FIG. 8H is a cross-sectional view of the semiconductor structure of FIG. 8G after removing the dielectric layer 240, the barrier layer 232, and the patterned hard mask layer 228P from the topmost surfaces of the first and second conductive lines 230A, 230B, in accordance with some embodiments.

The removal of the dielectric layer 240, the barrier layer 232, and the patterned hard mask layer 228P from the topmost surfaces of the first and second conductive lines 230A, 230B can be implemented by one or more CMP processes described above in FIG. 2H. After CMP, the top surface of the dielectric layer 240 and the barrier layer 232 are substantially coplanar with the topmost surfaces of the first and second conductive lines 230A, 230B (i.e., the top surfaces of the conductive portions 224P). The top surfaces of the conductive portions 224P are exposed.

In the semiconductor structure 800, by providing conductive portion 224P of different thicknesses in the first and second conductive lines 230A, 230B to compensate the height difference of the first and second conductive lines 230A, 230B due to the presence of the low surface portion 210A and the high surface portion 210B in the via-containing layer 210, the air gap punch through caused by the uneven topography of the underlying via-containing layer 210 during planarizing the overlying air gap-containing dielectric layer 240 is prevented. This additional topography reset methodology helps to improve the reliability of the integrated circuits.

It should be noted that although the semiconductor structure 800 illustrates an embodiment where the vias 214 are located in the low surface portion 210A of the via-containing layer 210, the first conductive lines 230A are formed as narrow lines, and the second conductive line 230B is formed as a wide line, an embodiment where the vias 214 are located in the high surface portion 210B of the via-containing layer 210, the first conductive line 230A is formed as a wide line, and the second conductive lines 230B are formed as narrow lines is also contemplated.

One aspect of this description relates to a semiconductor structure. The semiconductor structure includes a substrate and a first dielectric layer having at least one via over the substrate. The first dielectric layer includes a first portion having a first thickness and a second portion having a second thickness greater than the first thickness. The semiconductor structure further includes a second dielectric layer containing at least one first conductive line overlying the first portion of the first dielectric layer and at least one second conductive line overlying the second portion of the first dielectric layer. The at least one first conductive line includes a first conductive portion and a conductive cap, and the at least one second conductive line including a second conductive portion having a top surface coplanar with a top surface of the conductive cap.

Another aspect of this description relates to a semiconductor structure. The semiconductor structure includes a first dielectric layer comprising a plurality of vias over a substrate. The first dielectric layer includes a first portion having a first thickness and a second portion having a second thickness greater than the first thickness. The semiconductor structure further includes a second dielectric layer having a plurality of first conductive lines overlying the first portion of the first dielectric layer and a plurality of second conductive lines overlying the second portion of the first dielectric layer. Each of the plurality of first conductive lines and the plurality of second conductive lines includes a conductive portion and a conductive cap, the conductive cap in the plurality of first conductive lines having a thickness different from a thickness of the conductive cap in the plurality of second conductive lines.

Still another aspect of this description relates to a method of forming a semiconductor structure. The method includes forming at least one via in a first dielectric layer over a substrate. The first dielectric layer has a stepped topography including a first portion having a first thickness and a second portion having a second thickness greater than the first thickness. The method further includes depositing a conductive material layer over the first dielectric layer and the at least one via, the conductive material layer conforming to the stepped topography of the first dielectric layer. The method further includes depositing a conductive cap layer over the conductive material layer, the conductive cap layer conforming to the stepped topography of the first dielectric layer. The method further includes planarizing the conductive cap layer, etching the conductive cap layer and the conductive material layer to form at least one first conductive line overlying the first portion of the first dielectric layer and at least one second conductive line overlying the second portion of the first dielectric layer and forming a second dielectric layer surrounding the at least one first conducive line and the at least one second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
a substrate;
a first dielectric layer comprising at least one via over the substrate, the first dielectric layer comprising a first portion having a first thickness and a second portion having a second thickness greater than the first thickness; and a second dielectric layer comprising at least one first conductive line overlying the first portion of the first dielectric layer and at least one second conductive line overlying the second portion of the first dielectric layer, wherein the at least one first conductive line comprises a first conductive portion and a conductive cap, and the at least one second conductive line comprises a second conductive portion, the second conductive portion having a top surface coplanar with a top surface of the conductive cap.

2. The semiconductor structure of claim 1, wherein the first conducive portion and second conductive portion comprise a first conductive material, and the conductive cap comprises a second conductive material different from the first conductive material.

3. The semiconductor structure of claim 2, wherein the first conductive portion, the second conductive portion and the conductive cap independently comprise ruthenium, iridium, rhodium, platinum, cobalt, molybdenum, tungsten, copper, nickel, silver, aluminum or combinations thereof.

4. The semiconductor structure of claim 1, wherein the at least one via is in the first portion of the first dielectric layer, the at least one first conductive line in electrical contact with the at least one via.

5. The semiconductor structure of claim 4, wherein the at least one first conductive line has a first width, and the at least one second conductive line has a second width greater than the first width.

6. The semiconductor structure of claim 1, wherein the at least one via is in the second portion of the first dielectric layer, the at least one second conductive line in electric contact with the at least one via.

7. The semiconductor structure of claim 6, wherein the at least one first conductive line has a first width, and the at least one second conductive line has a second width less than the first width.

8. The semiconductor structure of claim 1, wherein the second dielectric layer further comprises air gaps between the at least one first conductive line and the at least one second conductive line.

9. The semiconductor structure of claim 1, wherein the at least one first conductive line further comprises a first glue portion beneath the first conductive portion, and the at least one second conductive line further comprises a second glue portion beneath the second conductive portion.

10. The semiconductor structure of claim 9, wherein the first glue portion and the second glue portion comprises tantalum nitride, titanium nitride, manganese nitride or tungsten nitride.

11. The semiconductor structure of claim 1, further comprising a barrier layer surrounding the at least one first conductive line and the at least one second conductive line.

12. A semiconductor structure, comprising:
a first dielectric layer comprising a plurality of vias over a substrate, the first dielectric layer comprising a first portion having a first thickness and a second portion having a second thickness greater than the first thickness; and
a second dielectric layer comprising a plurality of first conductive lines overlying the first portion of the first dielectric layer and a plurality of second conductive lines overlying the second portion of the first dielectric layer, wherein each of the plurality of first conductive lines and the plurality of second conductive lines comprises a conductive portion and a conductive cap, the conductive cap in the plurality of first conductive lines having a thickness different from a thickness of the conductive cap in the plurality of second conductive lines.

13. The semiconductor structure of claim 12, wherein the conductive cap comprises a conductive material different from that of the conductive portion.

14. The semiconductor structure of claim 12, wherein the conductive portion in the plurality of first conductive lines and the conductive portion in the plurality of second conductive lines have a same thickness.

15. The semiconductor structure of claim 12, wherein the second dielectric layer further comprises air gaps between the plurality of first conductive lines and the plurality of second conductive lines.

16. The semiconductor structure of claim 12, further comprising a barrier layer surrounding each of the plurality of first conductive lines and the plurality of second conductive lines.

17. The semiconductor structure of claim 16, wherein the barrier layer comprises silicon carbon nitride, silicon carbide, oxygen-doped silicon carbide, aluminum oxide or aluminum oxynitride.

18. A method of forming a semiconductor structure, comprising:
forming at least one via in a first dielectric layer over a substrate, wherein the first dielectric layer has a stepped topography comprising a first portion having a first thickness and a second portion having a second thickness greater than the first thickness;
depositing a conductive material layer over the first dielectric layer and the at least one via, the conductive material layer conforming to the stepped topography of the first dielectric layer;
depositing a conductive cap layer over the conductive material layer, the conductive cap layer conforming to the stepped topography of the first dielectric layer;
planarizing the conductive cap layer;
etching the conductive cap layer and the conductive material layer to form at least one first conductive line overlying the first portion of the first dielectric layer and at least one second conductive line overlying the second portion of the first dielectric layer; and
forming a second dielectric layer surrounding the at least one first conducive line and the at least one second conductive line.

19. The method of claim 18, wherein planarizing the conductive cap layer comprises completely removing the conductive cap layer from a first portion of the conductive material layer overlying the second portion of the first dielectric layer to expose the first portion of the conductive material layer.

20. The method of claim 18, wherein planarizing the conductive cap layer comprises partially removing the conductive cap layer to provide a planar top surface across the substrate, wherein a first portion of the conductive cap layer overlying the first portion of the first dielectric layer has a thickness greater than a thickness of a second portion of the conductive cap layer overlying the second portion of the first dielectric layer.

* * * * *